United States Patent [19]

Schetzina

[11] Patent Number: 5,670,798
[45] Date of Patent: Sep. 23, 1997

[54] INTEGRATED HETEROSTRUCTURES OF GROUP III-V NITRIDE SEMICONDUCTOR MATERIALS INCLUDING EPITAXIAL OHMIC CONTACT NON-NITRIDE BUFFER LAYER AND METHODS OF FABRICATING SAME

[75] Inventor: Jan Frederick Schetzina, Cary, N.C.

[73] Assignee: North Carolina State University, Raleigh, N.C.

[21] Appl. No.: 412,971

[22] Filed: Mar. 29, 1995

[51] Int. Cl.$^6$ .......................... H01L 33/00; H01L 31/075; H01L 31/105; H01L 31/117
[52] U.S. Cl. .......................... 257/96; 257/101; 257/458
[58] Field of Search .......................... 257/96, 101, 458

[56] References Cited

U.S. PATENT DOCUMENTS

| | | | |
|---|---|---|---|
| 4,801,984 | 1/1989 | Woodall | 357/16 |
| 5,294,833 | 3/1994 | Schetzina | 257/741 |
| 5,351,255 | 9/1994 | Schetzina | 372/45 |
| 5,366,927 | 11/1994 | Schetzina | 437/185 |
| 5,385,862 | 1/1995 | Moustakas | 437/107 |

FOREIGN PATENT DOCUMENTS

| | | |
|---|---|---|
| 0377940 | 7/1990 | European Pat. Off. . |
| 2250635 | 6/1992 | United Kingdom . |

OTHER PUBLICATIONS

Detchprom et al. "Hydride vapor phase epi growth . . . GaN film using a ZnO buffer", Appl Phys Ltts 61(22) 30 Nov. 1992, pp. 2688–2690.

Detchprohm et al., "Hydride Vapor Phase Epitaxial Growth of a High Quality GaN Film," *Applied Physics Letters*, vol. 61, No. 22, 1992.

Nakamura, "Blue/Green Semiconductor Laser", 1996 LEOS Meeting, Paper M1.1, pp. 3–4.

Nakamura et al., "InGaN Multi–Quantum–Well Structure Laser Diodes Grown on MgAl$_2$O$_4$ Substrates", Appl. Phys. Lett., V. 68, No. 15, Apr. 8, 1996, pp. 2105–2107.

Nakamura et al., "InGaN–Based Multi–Quantum–Well–Structure Laser Diodes", Jpn. J. Appl. Phys., vol. 35, Part 2, No. 1B, January 15, 1996, pp. L74–L76.

Koike et al., "Light–Emitting Devices Based on Gallium Nitride and Related Compound Semiconductors", Mat. Res. Soc. Symp. Proc., vol. 395, 1996, pp. 889–895.

Barnes et al., "Calculations of the Specific Resistance of Contacts to III–V Nitride Compounds", Mat. Res. Soc. Symp. Proc., vol. 395, 1996, pp. 849–854.

Kong et al., "AlGaN/GaN/AlGaN Double–Heterojunction Blue LEDs on 6H–SiC Substrates", Mat. Res. Soc. Symp. Proc., vol. 395, 1996, pp. 903–907.

(List continued on next page.)

*Primary Examiner*—Stephen Meier
*Attorney, Agent, or Firm*—Bell, Seltzer, Park & Gibson

[57] ABSTRACT

An integrated heterostructure of Group III-V nitride compound semiconductors is formed on a multicomponent platform which includes a substrate of monocrystalline silicon carbide and a non-nitride buffer layer of monocrystalline zinc oxide. The zinc oxide may be formed by molecular beam epitaxy (MBE) using an MBE effusion cell containing zinc, and a source of atomic oxygen, such as an MBE-compatible oxygen plasma source which converts molecular oxygen into atomic oxygen. An ohmic contact for a semiconductor device formed of Group III-V nitride compound semiconductor materials including a layer of aluminum nitride or aluminum gallium nitride, includes a continuously graded layer of aluminum gallium nitride and a layer of gallium nitride or an alloy thereof on the continuously graded layer. The continuously graded layer eliminates conduction or valence band offsets. A multiple quantum well may also be used instead of the continuously graded layer where the thickness of the layers of gallium nitride increase across the multiple quantum well. The ohmic contacts may be used for Group III-V nitride laser diodes, light emitting diodes, electron emitters, bipolar transistors and field effect transistors.

29 Claims, 27 Drawing Sheets

OTHER PUBLICATIONS

Schetzina, "*Growth and Properties of III–V Nitride Films, Quantum Well Structures and Integrated Heterostructure Devices*", Mat. Res. Soc. Symp. Proc., vol. 395, 1996, pp. 123–134.

Ng, "*Negative–Electron–Affinity Photocathode*", Complete Guide to Semiconductor Devices, Chapter 57, McGraw–Hill Series in Electrical and Computer Engineering, McGraw–Hill (New York), 1995.

Molnar et al., *Blue–Violet Light Emitting Gallium Nitride p–n Junctions Grown by Electron Cyclotron Resonance–Assisted Molecular Beam Epitaxy*, Applied Physics Letters, vol. 66, No. 3, Jan. 16, 1995, pp. 268–270.

Segall et al., *Band–Offsets and Related Properties of III–N's*, 2nd Workshop on Wide Bandgap Nitrides, Oct. 17–18, 1994, St. Louis, MO, program schedule for oral presentation.

T. Chu et al., *The Role of Barium in the Heteroepitaxial Growth of Insulator and Semiconductors on Silicon*, Materials Research Society Symposium Proceedings, vol. 334, pp. 501–506 (1994).

Morkoc et al., *Large–Band–Gap SiC, III–V Nitride, and II–VI ZnSe–Based Semiconductor Device Technologies*, Journal of Applied Physics, vol. 76, No. 3, Aug. 1, 1994, pp. 1363–1398.

Baur et al., *Determination of the GaN/AlN Band Offset Via the (–/0) Acceptor Level of Iron*, Applied Physics Letters, vol. 65. No. 17, Oct. 24, 1994, pp. 2211–2213.

Martin et al., *Valence–Band Discontinuity Between GaN and AlN Measured by X–Ray Photoemission Spectroscopy*, Applied Physics Letters, vol. 65, No. 5, Aug. 1, 1994, pp. 610–612.

Benjamin et al., *Observation of a Negative Electron Affinity for Heteroepitaxial AlN on α(6H)–SiC(0001)*, Applied Physics Letters, vol. 64, 24, Jun. 13, 1994, pp. 3288–3290.

Lin et al., *Nonalloyed Ohmic Contacts on GaN using InN/GaN Short–Period Superlattices*, Applied Physics, Letters, vol. 64, No. 19, May 9, 1994, pp. 2557–2559.

A.R. Powell et al., *New Approach to the Growth of Low Dislocation Relaxed SiGe Material*, Applied Physics Letters, vol. 64, No. 14, Apr. 4, 1994, pp. 1856–1858.

Nakamura et al., *Candela–Class High–Brightness InGaN/AlGaN Double–Heterostructure Blue–Light–Emitting Diodes*, Applied Physics Letters, vol. 64, No. 13, Mar. 28, 1994, pp. 1687–1689.

Amano et al., *Room–Temperature Violet Stimulated Emission from Optically Pumped AnGaN/GaInN Double Heterostructure*, Applied Physics Letters, vol. 64, No. 11, Mar. 14, 1994, pp. 1377–1379.

Yung et al., *Observation of Stimulated Emission in the Near Ultraviolet from a Molecular Beam Epitaxy Grown GaN Film on Sapphire in a Vertical–Cavity, Single Pass Configuration*, Applied Physics Letters, vol. 64, No. 19, Feb. 28, 1994 pp. 1135–1137.

Khan et al., *High Electron Mobility Transistor Based on a $GaN-Al_xG_{1-x}N$ Heterojunction*, Applied Physics Letters, vol. 63, No. 9, Aug. 30, 1993, pp. 1214–1215.

Foresi et al., *Metal Contacts to Gallium Nitride*, Applied Physics Letters, vol. 62, No. 22, pp. 2859–2861, May 31, 1993.

Khan et al., *Metal Semiconductor Field Effect Transistor Based on Single Crystal GaN*, Applied Physics Letters, vol. 62, No. 15, Apr. 12, 1993, pp. 1786–1787.

Strite et al., *GaN, AlN, and InN: A Review*, Journal of Vacuum Science and Technology B, vol. 10, No. 4, Jul./Aug. 1992, pp. 1237–1266.

Hu, *Misfit Dislocations and Critical Thickness of Heteroepitaxy*, Journal of Applied Physics, vol. 69, No. 11, Jun. 1, 1991, pp. 7901–7903.

Tsao, et al., *Excess Stress and the Stability of Strained Heterostructures*, Applied Physics Letters, vol. 53, No. 10, Sep. 5, 1988, pp. 848–850.

Amano et al., *Metalorganic Vapor Phase Epitaxial Growth of a High Quality GaN Film Using an AlN Buffer Layer*, Applied Physics Letters, vol. 48, No. 5, Feb. 3, 1986, pp. 353–355.

People et al., *Calculation of Critical Layer Thickness versus Lattice Mismatch for $Ge_xSi_{1-x}/Si$ Strained Layer Heterostructures*, Applied Physics Letters, vol. 47, No. 3, Aug. 1, 1985, pp. 322–324.

Matthews et al., *Defects in Epitaxial Multilayers—III. Preparation of Almost Perfect Multilayers*, Journal of Crystal Growth, vol. 32, pp. 265–273, 1976.

Matthews et al., *Defects in Epitaxial Multilayers—II. Dislocation Pile–Ups, Threading Dislocations, Slip Lines and Cracks*, Journal of Crystal Growth, vol. 29, pp. 273–280, 1975.

Matthews et al., *Defects in Epitaxial Multilayers—I. Misfit Dislocations*, Journal of Crystal Growth, vol. 27, pp.118–125, 1974.

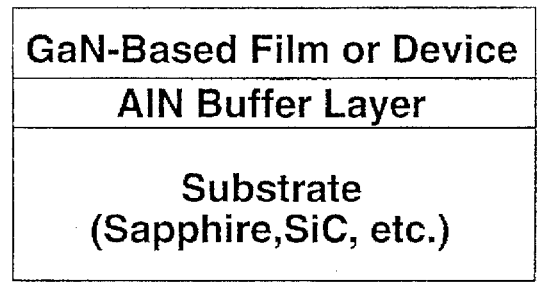
FIG. 13.
(PRIOR ART)
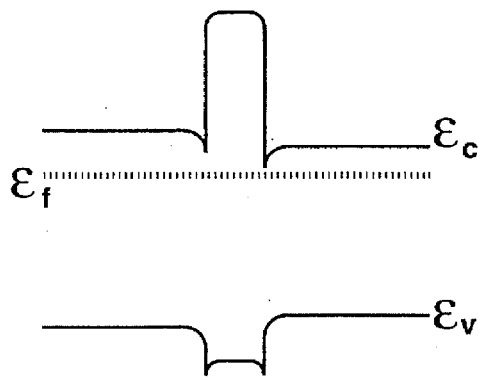
GaN　AlN　SiC
FIG. 14A.
FIG. 14B.
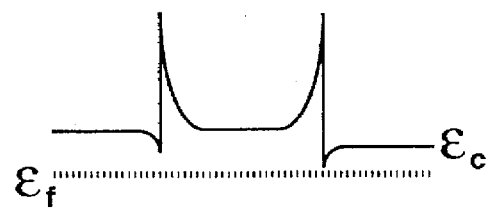
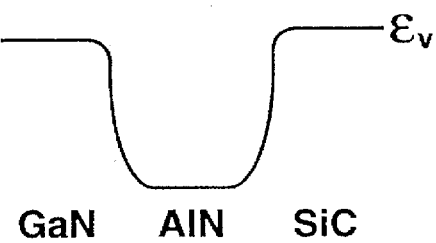
GaN　AlN　SiC

INTEGRATED HETEROSTRUCTURES OF GROUP III-V NITRIDE SEMICONDUCTOR MATERIALS INCLUDING EPITAXIAL OHMIC CONTACT NON-NITRIDE BUFFER LAYER AND METHODS OF FABRICATING SAME

FIELD OF THE INVENTION

This invention relates to semiconductor devices, and more particularly to semiconductor devices containing Group III-V nitride compound semiconductor materials.

BACKGROUND OF THE INVENTION

Microelectronic applications of Group III-V nitride semiconductor materials have recently been investigated. Group III-V nitride semiconductor materials include aluminum nitride (AlN), gallium nitride (GaN), and indium nitride (InN) and their related ternary and quaternary alloys such as aluminum gallium nitride AlGaN.

Group III-V nitride semiconductors have bandgaps ranging from 1.9 eV to 6.2 eV as shown in FIG. 1. Thus, these semiconductor materials are suitable for a range of potential applications including ultraviolet to visible optoelectronics (for example LEDs and lasers) and high temperature electronics (for example transistors). In addition, the negative electron affinity (NEA) nature of the conduction band of AlN makes this Group III-V nitride semiconductor a potential new and efficient electron source in cold cathode, microelectronics, and flat panel electro-luminescent display applications. See, for example, review articles by Strite et al. entitled *GaN, AlN, and InN: A Review*, Journal of Vacuum Science and Technology B, Vol. 10, pp. 1237–1266, 1992, and Morkoc et al. entitled *Large-Band-Gap SiC, III-V Nitride, and II–VI ZnSe-Based Semiconductor Device Technologies*, Journal of Applied Physics, Vol. 76, pp. 1363–1398, 1994.

Recent advances in Group III-V nitride device development include the demonstration of high-brightness blue light-emitting diodes as described in the publication by Nakamura et al. entitled *Candela-Class High-Brightness InGaN/AlGaN Double-Heterostructure Blue-Light-Emitting Diodes*, Applied Physics Letters, Vol. 64, pp. 1687–1689, 1994. A second group of researchers has demonstrated transistor structures based on Group III-V nitrides as described in the publications by Khan et al. entitled *Metal Semiconductor Field Effect Transistor Based on Single Crystal GaN*, Applied Physics Letters, Vol. 62, pp. 1786–1787, 1993 and *High Electron Mobility Transistor Based on a GaN-Al$_x$Ga$_{1-x}$N Heterojunction*, Applied Physics Letters, Vol. 63, pp.1214–1215, 1993.

Several groups of researchers also report optically-pumped stimulated emission from III-V nitride structures, which can form the basis for laser diodes. See the publications by Amano et al. entitled *Room-Temperature Violet Stimulated Emission from Optically Pumped AnGaN/GaInN Double Heterostructure*, Applied Physics Letters, Vol. 64, pp. 1377–1379, 1994, and Yung et al. entitled *Observation of Stimulated Emission in the Near Ultraviolet from a Molecular Beam Epitaxy Grown GaN film on Sapphire in a Vertical-Cavity, Single Pass Configuration*, Applied Physics Letters, Vol. 64, pp. 1135–1137, 1994.

Accordingly, Group III-V nitride compound semiconductors are expected to play an increasingly important role in high-temperature microelectronics. Unfortunately, there are presently two fundamental obstacles to the design and fabrication of Group III-V nitride compound semiconductor devices: the lack of a suitable lattice-matched and conducting substrate, and the lack of a suitable ohmic contact for these materials. Each of these fundamental obstacles will now be described.

The first fundamental obstacle which presently limits the overall quality of Group III-V nitride films and devices is the lack of a suitable lattice-matched and preferably conducting substrate for Group III-V nitride growth. Bulk substrates of single-crystal Group III-V nitrides are not presently available. As a consequence, sapphire and silicon carbide (SIC) —both of which have lattice constants that are appreciably different from those of the III-V nitrides as listed in Table I—are currently preferred substrates for Group III-V nitride film growth.

For growth on sapphire, which is an electrically insulating substrate material, a two-step growth process has been employed for growth of GaN-based materials. Amano et al. in the publication entitled *Metalorganic Vapor Phase Epitaxial Growth of a High Quality GaN Film Using an AlN Buffer Layer*, Applied Physics Letters, Vol. 48, pp. 353–355, 1986, describes the use of a thin buffer layer of AlN grown at low temperatures (about 600° C.) on sapphire. The temperature is then raised to about 900°–1100° C. for growth of GaN. In U.S. Pat. No. 5,290,393, Nakamura describes the use of a Al$_{1-x}$Ga$_x$N buffer layer (0≦x≦1) grown at low temperatures (400°–800° C.) on sapphire followed by growth of GaN at a higher temperature (about 900°–1000° C.). More specifically, Nakamura et al. in the publication entitled *Candela-Class High-Brightness InGaN/AlGaN Double-Heterostructure Blue-Light-Emitting Diodes*, Applied Physics Letters, Vol. 64, pp. 1687–1689, 1994, employs a 300 Å thick GaN buffer layer grown at 510° C. on sapphire. Next, the substrate temperature is elevated to 1020° C. to grow GaN films. Similar processes have also been employed for growth of III-V nitride films on SiC. However, it has been generally found that crack-free III-V nitride growth on SiC requires the use of an AlN buffer layer. Buffer layers of GaN or Al$_{1-x}$Ga$_x$N often result in III-V nitride film growth which contain networks of cracks. This is unacceptable for device applications.

TABLE I

PROPERTIES OF SELECTED SEMICONDUCTORS

| Material | Lattice Constant | Band gap (eV) | Thermal Expansion (× 10$^{-6}$/°K.) |
|---|---|---|---|
| GaN | a = 3.189Å | 3.39 (300K) | Δa/a = 5.6 (300–900° K.) |
|  | c = 5.185Å | 3.50 (1.6K) | Δc/c = 3.2 (300–700° K.) |
|  |  |  | Δc/c = 7.8 (700–900° K.) |
| AlN | a = 3.112Å | 6.2 (300K) | Δa/a = 5.3 (300–1100° K.) |
|  | c = 4.982Å | 6.28 (5K) | Δc/c = 4.2 (300–1100° K.) |
| InN | a = 3.548Å | 1.89 (300K) | Δa/a = 3.8–6.0 (300–600° K.) |
|  | c = 5.760Å |  | Δc/c = 3.0–3.8 (300–600° K.) |
| Sapphire | a = 4.758Å |  | Δa/a = 7.3–7.7 (300–1100° K.) |
|  | c = 12.991Å |  | Δc/c = 8.1 –8.6 (300–1100° K.) |
| SiC (6H) | a = 3.08Å | 2.86 (300K) | Δa/a = 4.2–5.4 (700–1500° K.) |
|  | c = 15.12Å |  | Δc/c = 4.7–4.9 (700–1500° K.) |
| ZnO | a = 3.252Å | 3.30 (300K) | Δa/a = 4.8–6.0 (300–400° K.) |
|  | c = 5.213Å |  | Δa/a = 7.2–8.3 (500–800° K.) |
|  |  |  | Δc/c = 2.9–3.8 (300–400° K.) |
|  |  |  | Δc/c = 4.4–5.0 (500–800° K.) |
| Si | a = 5.4301Å | 1.10 (300K) | Δa/a = 3.2–5.6 (300–1100° K.) |
| GaAs | a = 5.6533Å | 1.43 (300K) | Δa/a = 5.0–6.1 (200–600° K.) |

The use of a low-temperature buffer layer on sapphire or SiC has allowed Group III-V nitride films to be fabricated. Unfortunately, the two-temperature technique has not heretofore been able to produce nitride layers having sufficiently low dislocation density, to the best of the present inventor's knowledge for many potential device applications. It is generally known that Group III-V nitride materials grown on sapphire or SiC substrates contain $10^9$–$10^{11}$ dislocations per $cm^2$. By comparison, Group II-VI semiconductor devices based on ZnSe or related alloys generally contain less than $10^6$ dislocations per $cm^2$, and Group III-V As-based and P-based semiconductor devices contain less than $10^4$ dislocations per $cm^2$.

In addition, the large difference in thermal expansion coefficients between SiC and GaN presents problems. Since the expansion coefficient ($\Delta a/a$) of SiC is less than that of GaN (see Table I above) upon cooling to room temperature after thin film growth, the GaN film on SiC is under tension. As is well-known to those skilled in the art of semiconductor film growth, this in itself can lead to cracking effects which destroy the overall quality of the epitaxial layer.

However, it is extremely desirable that Group III-V nitride materials be grown on a conducting substrate, particularly for device applications involving vertical transport of carriers. Such devices include light-emitting diodes, laser diodes, and certain transistor structures, for example. The Nakamura et al. blue LED discussed above requires non-standard processing and packaging techniques because the sapphire substrate is electrically insulating. Specifically, as described by Nakamura et al. in *Candela-Class High-Brightness InGaN/AlGaN Double-Heterostructure Blue-Light-Emitting Diodes*, Applied Physics Letters, Vol. 64, pp. 1687–1689, 1994, InGaN/AlGaN mesa LED structures must be fabricated using photolithographic and etching techniques so that both the metallic electrical contact to the top p-type layer of the device and the base metallic electrical contact to the bottom n-type layer of the device can be made from the top surface of the wafer using wire bonding techniques. This approach is required due to the insulating nature of the sapphire substrate which is used.

A conducting substrate such as SiC is much preferred since a conducting substrate allows the LED base metallic electrode to be located on the bottom surface of the substrate, rather than at the top surface. As a consequence, packaged LED lamps can be fabricated more efficiently using standard techniques which employ silver epoxy to secure the LED base electrode and require only one wire-bonded top contact—an important cost-saving advantage in an LED production facility. In addition, vertical transport through a low-resistance conducting substrate such as SiC may be essential for the future development of other optoelectronic devices based on III-V nitride semiconductors such as laser diodes. It is well known to those skilled in the art that a laser diode requires a much higher current density when operating above threshold than does an LED. As a consequence, the series resistance of the device must generally be as small as possible to minimize heating effects which can lead to premature device degradation and failure. This generally requires the use of a conducting substrate. Accordingly, there is a need for a conducting substrate for Group III-V nitride semiconductor materials.

The ohmic contact problem for Group III-V nitride semiconductors will now be described. Important advances in understanding the fundamental properties of Group III-V nitride materials have recently been made by several research groups. Benjamin et al., in the publication entitled *Observation of a Negative Electron Affinity for Heteroepitaxial AlN on α (6H)-SiC(0001)*, Applied Physics Letters, Vol. 64, pp. 3288–3290, 1994, report convincing evidence based on ultraviolet photoemission spectroscopy (UPS) that AlN is a negative electron affinity (NEA) material. In other words, the conduction band of AlN lies above the vacuum energy level implying that AlN can be used as an efficient emitter of electrons. Consistent with these findings, the above investigators also report the valence band offset between AlN(0001) and SIC(0001) to be approximately 0.8 eV.

Three other research groups have recently reported values for the valence band offset between AlN and GaN. Martin et al. in the publication entitled *Valence-Band Discontinuity Between GaN and AlN Measured by X-Ray Photoemission Spectroscopy*, Applied Physics Letters, Vol. 65, pp. 610612, 1994, report a Type I heterojunction (valence band edge of AlN below that of GaN) with a valence band offset or discontinuity of $\Delta E_v=0.8\pm0.3$ eV. Baur et al. in the publication entitled *Determination of the GaN/AlN Band Offset Via the (-/0) Acceptor Level of Iron*, Applied Physics Letters, Vol. 65, pp. 2211–2213, 1994, report a Type 1 heterojunction with a valence band discontinuity of $\Delta E_v=0.5$ eV. Segall et al., in a paper presented at the 2nd Workshop on Wide Bandgap Nitrides held Oct. 17–18, 1994 in St. Louis, Mo. entitled *Band-Offsets and Related Properties of III-N's*, report $\Delta E_v=0.8$ eV for the valence band offset between AlN and GaN. In addition, these researchers report a Type 1 interface between GaN and InN with $\Delta E_v=0.5$ eV. Segall et al. also report a Type 1 interface between AlN and GaAs with $\Delta E_v=2.0$ eV.

The above results for band offsets have important consequences concerning the transport of electrons and holes through interfaces involving Group III-V nitride materials. FIG. 2 summarizes these results by illustrating schematically, in terms of energy band diagrams, how the conduction and valence bands of the binary Group III-V nitride semiconductors line up relative to one another and to other well-known semiconductor materials GaAs, Si and SiC. It will be recognized by those skilled in the art of semiconductor devices that FIG. 2 lists approximate band offsets among the various materials that are shown, based upon the above described reports. These band offsets may only be accurate to within ±0.2–0.3 eV, based on the accuracy of current experimental measurement techniques.

As is known by those skilled in the art, heterojunction energy barriers in excess of about 0.3 eV can prevent the flow of carriers (electrons and/or holes) in thin film devices which require vertical transport of charged carriers across heterointerfaces. Devices of this type include light emitting diodes, laser diodes, certain transistor structures, and electron emitters based on NEA materials such as AlN, for example. The band diagram of FIG. 2 clearly shows that there can be substantial energy barriers when these types of devices are based on III-V nitride heterostructures. Accordingly, contacts to Group III-V nitride compound semiconductor materials, using conventional metals such as silver and gold, are not ohmic.

The ohmic contact problem for Group III-V nitride compound semiconductors has recently been recognized by those skilled in the art other than the present inventor. See for example, the publication by Foresi and Moustakas at Boston University entitled *Metal Contacts to Gallium Arsenide*, Applied Physics Letters, Vol. 62, No. 22, pp. 2859–2861, May 1993, which reports an initial investigation of aluminum and gold contacts to gallium nitride. Both aluminum and gold contacts are reported as being ohmic. However, the contact resistivity of the aluminum and gold contacts were found to be $10^{-7}$–$10^{-8}$ $\Omega$-$m^2$. These contact resistances are several orders of magnitude greater than is generally required for laser diodes. A more recent publication by Molnar, Singh and Moustakas at Boston University, entitled *Blue-Violet Light Emitting Gallium Nitride*

*p-Gallium Nitride p-n Junctions Grown by Electron Cyclotron Resonance-Assisted Molecular Beam Epitaxy*, Applied Physics Letters, Vol. 66, No. 3, Jan. 16 1995, notes that ohmic metal contacts to p-type gallium nitride would require a metal with a work function close to 7.5 eV. The Molnar, Singh and Moustakas paper notes that such a metal is not available. This paper then reports on the use of Ni/Au to contact p-type GaN layers and In to contact n-type GaN layers. The resulting current-voltage characteristics as measured and reported are very poor. Accordingly, while those skilled in the art of Group III-V nitride compound semiconductors have recently recognized the lack of a suitable ohmic contact, a solution to this problem has not, to the best of the inventor's knowledge, been found.

In order to provide an ohmic contact to common intermetallic semiconductors such as GaAs, Woodall described in U.S. Pat. No. 4,801,984 the use of Group III-V ternary graded layers of InGaAs to make good electrical contact to GaAs. More recently, the present inventor described in U.S. Pat. Nos. 5,294,833, 5,351,255, and 5,366,927, ohmic contacts to Group II-VI materials using, for example, graded layers of ZnHgSe or ZnTeSe to make ohmic contact to Group II-VI blue/green light emitting devices.

However, it will be recognized by those skilled in the art that neither of the above contact systems can be used for Group III-V nitride materials, since the Group III-V nitride semiconductors have a hexagonal crystal structure which is incompatible with the cubic crystal structure of the Group III-V arsenides/phosphides and the Group II-VI materials based on ZnSe and related alloys. In addition, the basal plane lattice constants of the Group III-V nitrides are substantially different from the lattice constants and (111)-plane nearest-neighbor-distances of the Group III-V arsenides/phosphides and the Group II-VI materials based on ZnSe and related alloys. See FIG. 1.

The above survey indicates that, although significant advances have recently been made in demonstrating Group III-V nitride devices, a number of problems remain to be addressed. Specifically, Group III-V nitride materials grown to date have very high dislocation densities ($\geq 10_9$ per cm$^2$) due to the unavailability of lattice-matched bulk nitride substrates. In addition, the use of nonconductive substrates such as sapphire presently limit the use of Group III-V nitride materials to device applications which do not require vertical transport of carriers. Finally, significant energy barriers exist at interfaces between the Group III-V nitride materials and potential conducting substrates such as SiC, and between Group III-V nitride materials and all of the common metals which are needed for ohmic contacts in device applications. Accordingly, a low resistance ohmic contact is a fundamental problem for Group III-V nitride materials.

SUMMARY OF THE INVENTION

It is therefore an object of the present invention to provide an improved Group III-V nitride compound semiconductor device including a lattice matched substrate.

It is another object of the present invention to provide an improved Group III-V nitride compound semiconductor device including a lattice matched conducting substrate.

It is yet another object of the present invention to provide an improved Group III-V nitride compound semiconductor device including an ohmic contact.

These and other objects are provided, according to the present invention, by a multicomponent platform for forming thereon a semiconductor device of Group III-V nitride compound semiconductors. The multicomponent platform includes a substrate comprising monocrystalline semiconductor material and a buffer layer which comprises a non-nitride monocrystalline material on the substrate, such that monocrystalline Group III-V nitride compound semiconductor material may be formed on the buffer layer. Preferably, the buffer layer comprises a non-nitride monocrystalline material which has a lattice constant and coefficient of thermal expansion which are relatively close to the Group III-V nitride compound semiconductor.

In preferred embodiments of the multicomponent platform according to the present invention, the substrate comprises monocrystalline silicon carbide and/or monocrystalline sapphire, and the non-nitride buffer layer comprises monocrystalline zinc oxide, or some other compliant monocrystalline material, such that monocrystalline Group III-V nitride compound semiconductor material may be formed on the buffer layer. Monocrystalline zinc oxide is preferably formed using a molecular beam epitaxy (MBE) effusion cell for zinc, and an MBE-compatible oxygen plasma source which is used to convert molecular oxygen flowing into the plasma source, into atomic oxygen. The oxygen atoms and zinc atoms from the separate MBE sources impinge onto the substrate to epitaxially deposit monocrystalline zinc oxide.

In order to provide a conducting substrate for Group III-V nitride compound semiconductor materials, the substrate is preferably doped silicon carbide and the buffer layer is preferably doped monocrystalline zinc oxide. This multicomponent platform contrasts sharply from conventional substrates for forming Group III-V nitride compound semiconductor materials which typically include an aluminum nitride layer on a sapphire or silicon carbide substrate, and which have heretofore produced low quality Group III-V nitride material as manifested by high dislocation densities.

According to another aspect of the present invention, an ohmic contact is provided for a semiconductor device formed of Group III-V nitride compound semiconductor material including a first layer comprising a first binary Group III-V nitride compound semiconductor material or an alloy thereof wherein the first binary Group III-V nitride compound semiconductor material or an alloy thereof comprises a first Group III element and nitrogen which is doped a predetermined conductivity type. The ohmic contact comprises a second layer comprising a ternary Group III-V nitride compound semiconductor, including the first Group III element, a second Group III element and nitrogen, on the first layer.

The ternary Group III-V nitride compound semiconductor is doped the predetermined conductivity type and is continuously graded such that the concentration of the second Group III element relative to the first Group III element increases continuously from adjacent the first layer to opposite the first layer. The ohmic contact also includes a third layer comprising a second binary Group III-V nitride compound semiconductor material or an alloy thereof, including the second Group III element and nitrogen, on the second layer. The second binary Group III-V nitride compound semiconductor material or an alloy thereof is also doped the predetermined conductivity type. A conductor layer such as a metal layer is formed on the third layer.

The continuously graded ternary Group III-V nitride compound semiconductor material in the second layer, between the third layer and the first layer, eliminates the band offset between the first layer and the third layer. An ohmic contact for Group III-V nitride compound semiconductor materials is thereby provided.

Many alternative formulations of the second layer may be provided. In particular, in a first embodiment, the ternary Group III-V nitride compound semiconductor material is linearly graded, such that the concentration of the second Group III element relative to the first Group III element increases continuously and linearly from adjacent the first layer to opposite the first layer. In another embodiment, the ternary Group III-V nitride compound semiconductor is nonlinearly graded, and preferably parabolically graded, such that concentration of the second Group III element relative to the first Group III element increases continuously and nonlinearly, and preferably parabolically, from adjacent the first layer to opposite the first layer.

Preferably, the first layer comprises aluminum nitride or aluminum gallium nitride, which is doped the predetermined conductivity type. The second layer preferably comprises aluminum gallium nitride which is doped the predetermined conductivity type and which is continuously graded such that concentration of gallium relative to aluminum increases continuously from adjacent the first layer to opposite the first layer. The third layer preferably comprises gallium nitride. The conductor layer preferably comprises metal. When the first layer comprises aluminum gallium nitride, the concentration of gallium relative to aluminum in the first layer is preferably the same as the concentration of gallium relative to aluminum in the second layer adjacent the first layer.

In an alternate embodiment of the present invention, the second layer comprises a doped multiple quantum well (MQW) including alternating layers of the first binary Group III-V nitride compound semiconductor material or an alloy thereof and a second Group III-V nitride compound semiconductor material or an alloy thereof, on the first layer. The alternating layers are doped the predetermined conductivity type. The thickness of the layers of the second binary Group III-V nitride compound semiconductor material or an alloy thereof in the MQW structure increases from adjacent the first layer to opposite the first layer, where layer three composed of the second doped binary Group III-V nitride compound semiconductor material or an alloy thereof, is located.

Preferably, the second layer comprises a multiple quantum well of alternating layers of aluminum nitride or aluminum gallium nitride and gallium nitride or an alloy thereof on the first layer. The thickness of the layers of gallium nitride or an alloy thereof increase from adjacent the first layer to opposite the first layer.

One or more ohmic contacts according to the present invention may be integrated with a semiconductor device formed of Group III-V nitride compound semiconductor materials to form an integrated heterostructure device including an electronic or optoelectronic device and an ohmic contact wherein one heterostructure performs the device function, such as optical emission, field emission or transistor operation, and another heterostructure provides an electrical function, such as an ohmic contact. A multicomponent platform according to the invention is preferably combined with a semiconductor device or integrated heterostructure device of Group III-V nitride compound semiconductor materials to form a fully integrated heterostructure. The multicomponent platform forms the growth platform for the semiconductor device or integrated heterostructure device of Group III-V nitride compound semiconductor materials, and may also form a conductive path therefor.

Most preferably, according to the invention, an integrated heterostructure device including a multicomponent platform according to the present invention, one or more ohmic contacts according to the present invention and a semiconductor device of Group III-V nitride compound semiconductor material is provided. The multicomponent platform provides a new approach for high quality growth of Group II-VI nitride compound semiconductor materials, and ohmic contacts as required to provide a functional Group III-V nitride device which overcomes fundamental problems in Group III-V nitride compound semiconductor devices.

BRIEF DESCRIPTION OF THE DRAWINGS

FIG. 13 is a cross-sectional illustration showing a known substrate which uses an AlN buffer layer to nucleate a GaN-based device.

FIGS. 14A and 14B show energy band diagrams for the GaN/AlN/SiC/structure of FIG. 13, which employ thick versus thin AlN layers, respectively.

DETAILED DESCRIPTION OF THE PREFERRED EMBODIMENTS

Figure 1:
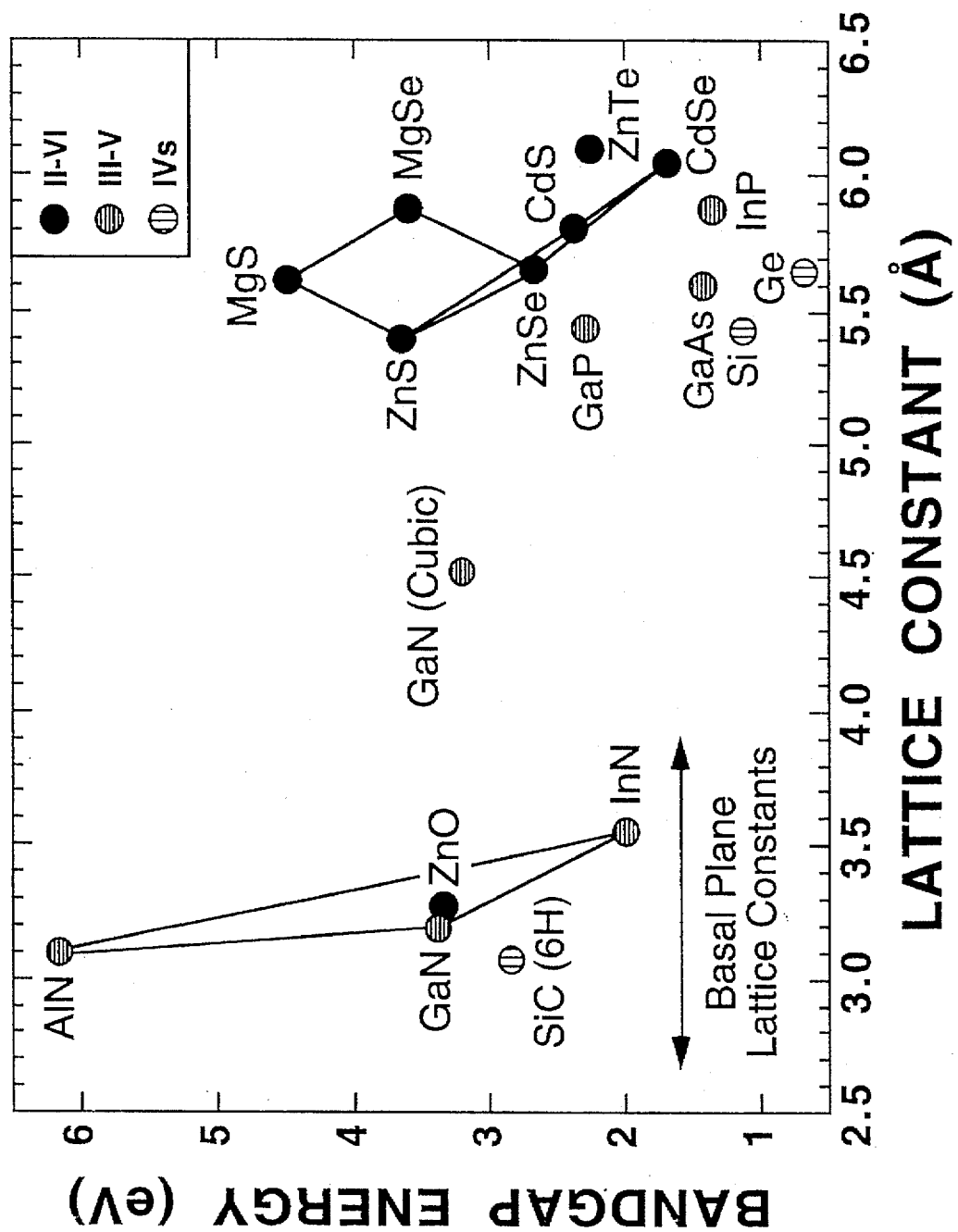
FIG. 1 graphically illustrates energy bandgaps of selected semiconductors versus lattice constant.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
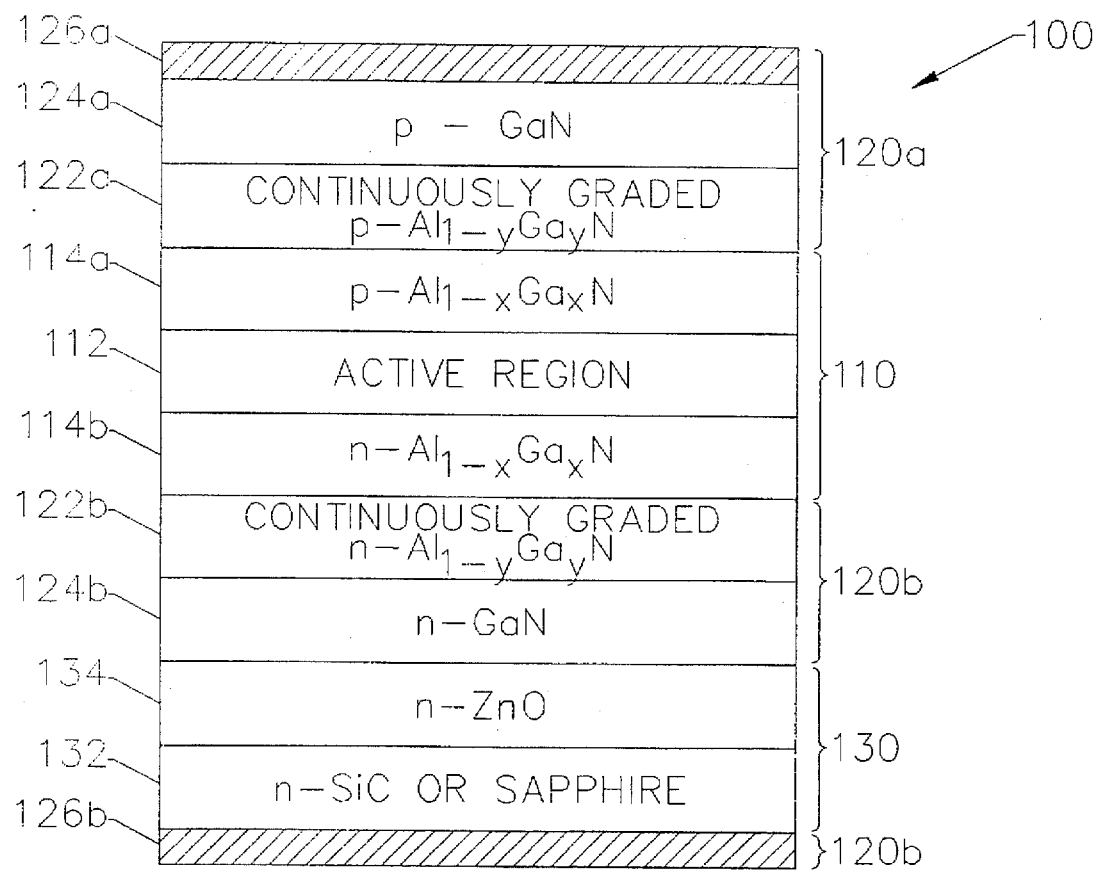
FIG. 3 is a cross-sectional illustration of a first embodiment of a Group III-V nitride compound semiconductor integrated heterostructure device.

Referring now to FIG. 3, a first embodiment of an integrated heterostructure device of Group III-V nitride compound semiconductor material according to the invention will now be described. The term integrated heterostructure or integrated heterostructure device (IHD) is here defined as a multilayered structure in which particular layers, or combinations of layers, perform distinctly different functions. An example of an IHD is a semiconductor surface-emitting laser which contains (a) multilayers for optical mirrors, (b) an active light generation region which may include one or more additional layers or quantum wells, (c) p-type and n-type layers which supply the active light generation region with electron and holes under forward bias, and (d) additional top layers for optically and electrically coupling the laser output to the outside world. These various functions are integrated into a single epitaxial multilayered structure using sophisticated growth techniques such as molecular beam epitaxy (MBE), metal-organic chemical vapor deposition (MOCVD), atomic layer epitaxy (ALE) or other techniques known to those skilled in the art of preparing semiconductor thin films and device structures. IHDs for blue/green light emission based on Group II-VI compound semiconductors are covered in U.S. Pat. Nos. 5,294,833, 5,351,255 and 5,366,927 mentioned above. The present invention describes integrated heterostructure devices of Group III-V nitride materials such as InN, GaN, AlN, and ternary/quaternary alloys thereof.

Referring now to FIG. 3, a first embodiment of an integrated heterostructure device of Group III-V nitride compound semiconductor materials according to the invention will now be described. As shown in FIG. 3, integrated heterostructure device 100 includes a semiconductor device 110 formed of Group III-V nitride compound semiconductors, and two ohmic contacts 120a, 120b therefor. The semiconductor device 110 and the ohmic contacts 120 which together form the integrated heterostructure device are grown on a multicomponent platform 130. Each of the elements 110, 120 and 130 will now be described in detail.

Still referring to FIG. 3 as a first example, semiconductor device 110 is shown as a double-heterojunction composed of $Al_{1-x}Ga_xN/GaN$ layers which form an LED optical emitter, but the semiconductor device may also be an electron emitter, a p-n junction diode, a transistor or other active semiconductor device, now known or developed later, formed of Group III-V nitride compound semiconductor materials. For example, the semiconductor device 110 may be a semiconductor laser diode which has an active region comprised of an InGaN quantum well surrounded by GaN light guiding layers and $Al_{1-x}Ga_xN$ cladding layers.

Semiconductor device 110, manifested as an LED, includes an active region 112, here GaN, which emits light, and two cladding (first) layers 114a and 114b, illustrated as $Al_{1-x}Ga_xN$ doped p-type and n-type, respectively. It will be understood that opposite conductivities from those shown in the drawings may be used. It will also be understood that x may be zero in layers 114a and 114b such that AlN is provided.

Still referring to FIG. 3, an ohmic contact 120 may be formed on one or both of the $Al_{1-x}Ga_xN$ cladding (first) layers 114a, 114b as required. The ohmic contacts 120a, 120b include graded (second) layers 122a, 122b comprised of $Al_{1-y}Ga_yN$ (y=x to y=1) between the $Al_{1-x}Ga_xN$ cladding layers 114a, 114b and the GaN (third) layers 124a and 124b. As shown in FIG. 3, the graded layers 122a, 122b comprised of $AL_{1-y}Ga_yN$ are doped the predetermined conductivity type, and are continuously graded such that y=x adjacent to the $Al_{1-x}Ga_xN$ cladding layers 114a, 114b and y=1 adjacent to the GaN layers 124a and 124b. The continuously graded layers 122a, 122b comprised of $Al_{1-y}Ga_yN$ serve as low resistance electronic links between the $AL_{1-x}Ga_xN$ cladding layers 114a, 114b, the GaN layers 124a and 124b, and external metal electrodes 126a, 126b to the semiconductor device itself, thereby greatly increasing its performance and efficiency.

Figure 4A:
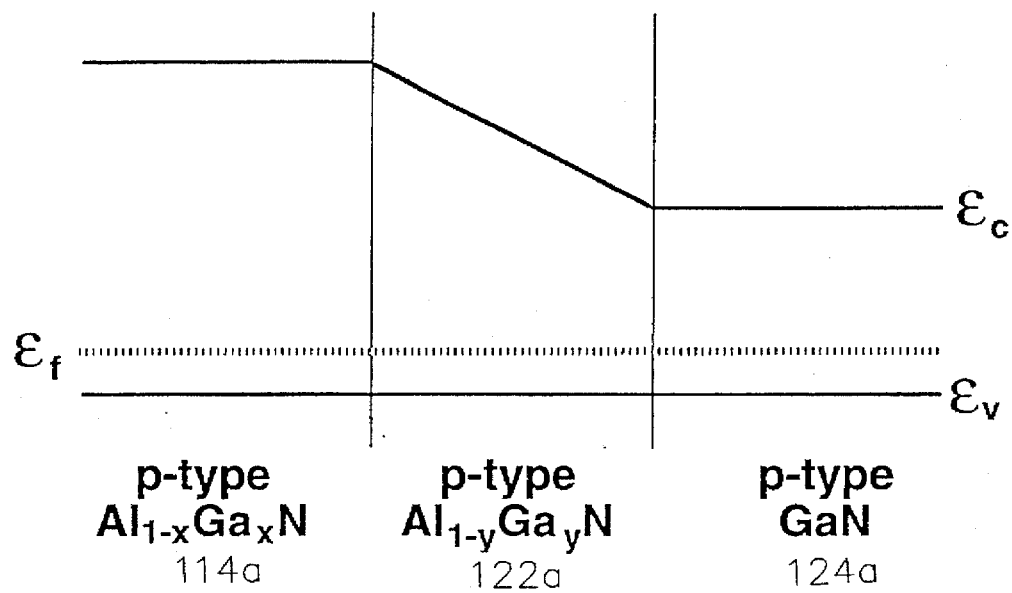
FIG. 4A is an energy band diagram in which a linear graded p-type layer of $Al_{1-y}Ga_yN$ is used to eliminate the valence band offset between p-type $Al_{1-x}Ga_xN$ and p-type GaN.
Figure 4B:
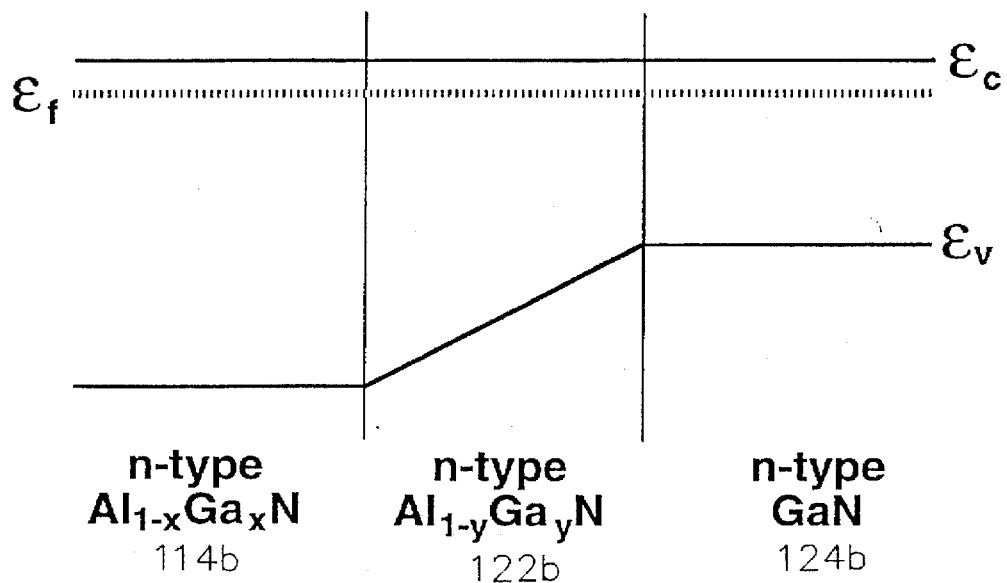
FIG. 4B is an energy band diagram in which a linear grand n-type layer of $Al_{1-y}Ga_yN$ is used to eliminate the conduction and offset between n-type $Al_{1-x}Ga_xN$ and n-type GaN.

The continuously graded $Al_{1-y}Ga_yN$ layers 122a and 122b may be linearly graded such that the concentration of gallium increases from y=x at the interface with the $Al_{1-x}Ga_xN$ cladding layers 114a, 114b, to Y=1 at the interfaces with the GaN layers 124a and 124b. This linear grading profile for the $Al_{1-y}Ga_yN$ layers 122a and 122b along the appropriate doping eliminates the band offsets between the $Al_{1-x}Ga_xN$ cladding layers 114a, 114b, and the GaN layers 124a and 124b which might otherwise impede the flow of carriers into the active region 112 of the device. This is illustrated by the energy band diagrams shown in FIGS. 4A and 4B. FIG. 4A shows the energy band diagram for the top p-type portion of the semiconductor device of FIG. 3 which illustrates how the linear grading along the p-type doping of the $Al_{1-y}Ga_yN$ layer 122a eliminates the valence band ($\epsilon_v$) offset between the p-type $Al_{1-x}Ga_xN$ cladding layer 114a and the p-type GaN layer 124a. Similarly, FIG. 4B shows the energy band diagram for the bottom n-type portion of the semiconductor device of FIG. 3 which illustrates how the linear grading along with n-type doping of the $Al_{1-y}Ga_yN$ layer 122b eliminates the conduction band $\epsilon_c$) offset between the n-type $AL_{1-x}Ga_xN$ cladding layer 114b and the n-type GaN layer 124b.

Figure 4C:
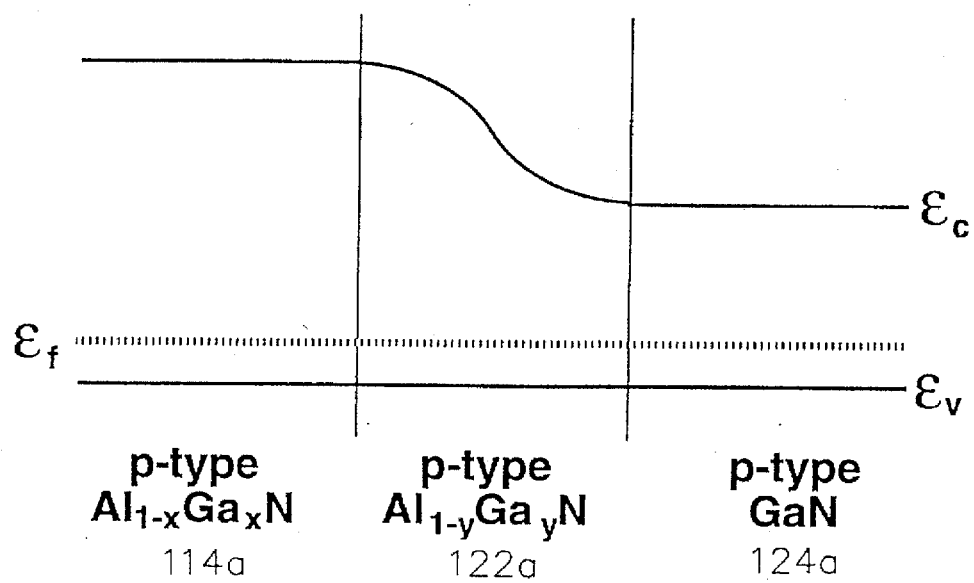
FIG. 4C is an energy band diagram in which a parabolically graded p-type layer of $Al_{1-y}Ga_yN$ is used to to eliminate the valence band offset between p-type $Al_{1-x}Ga_xN$ and p-type GaN.
Figure 4D:
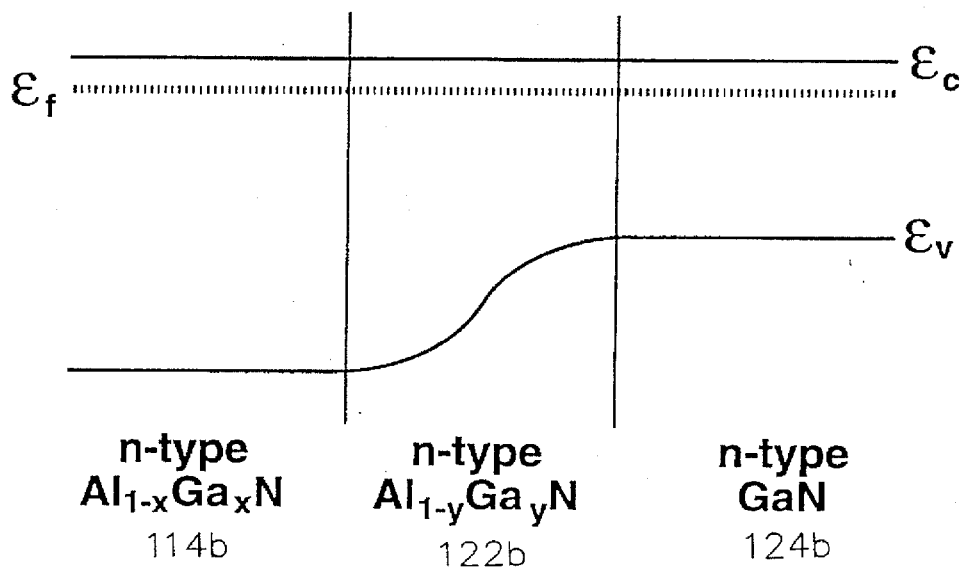
FIG. 4D is an energy band diagram in which a parabolically graded n-type layer of $Al_{1-y}Ga_yN$ is used to eliminate the conduction band offset between n-type $Al_{1-x}Ga_xN$ and n-type GaN

The continuously graded layer 122a, 122b may be linearly graded such that concentration of the gallium relative to aluminum increases continuously and linearly from adjacent layer 114a, 114b to opposite the layer 114a, 114b. Alternatively, nonlinear grading such as parabolic grading may be provided. See FIGS. 4C and 4D. It will be understood by those having skill in the art that, as used herein, "increases continuously" excludes a step graded layer, wherein the concentration of the material remains uniform across the layer. Continuously increasing grading includes linear and nonlinear continuously increasing grading.

Finally, ohmic contact 120a and 120b of FIG. 3 includes a conductor layer 126 such as a metal layer, on GaN layers 124a and 124b. A large-work-function metal such as gold or platinum is preferably used to contact the p-type GaN layer 124a and a small-work-function metal such as aluminum, indium, or titanium is preferably used to contact the n-type substrate 132 and hence, indirectly, the n-type GaN layer 124b. Combinations of these or other metals may also be employed. Also, according to the present invention, additional $In_{1-x}Ga_xN$ graded layers having the appropriate conductivity type can be inserted between the GaN layers 124 and metal contact layers 126 to further improve the ohmic contact between the GaN layers 124 and metal layers 126. This type of grading using $In_{1-x}Ga_xN$ is illustrated in FIGS. 9 through 12.

As shown in FIG. 3, layer 126a is directly on layer 124a while layer 126b is indirectly on layer 124b because other intervening layers are present. Accordingly, it will be understood by those having skill in the art that, as used herein, when a layer is formed "on" another layer, it may be formed directly on the other layer, or one or more intervening layers may be present. The use of the term "on" also includes a layer that is either above or below another layer, depending upon the ultimate orientation of the integrated heterostructure device 100.

Figure 5:
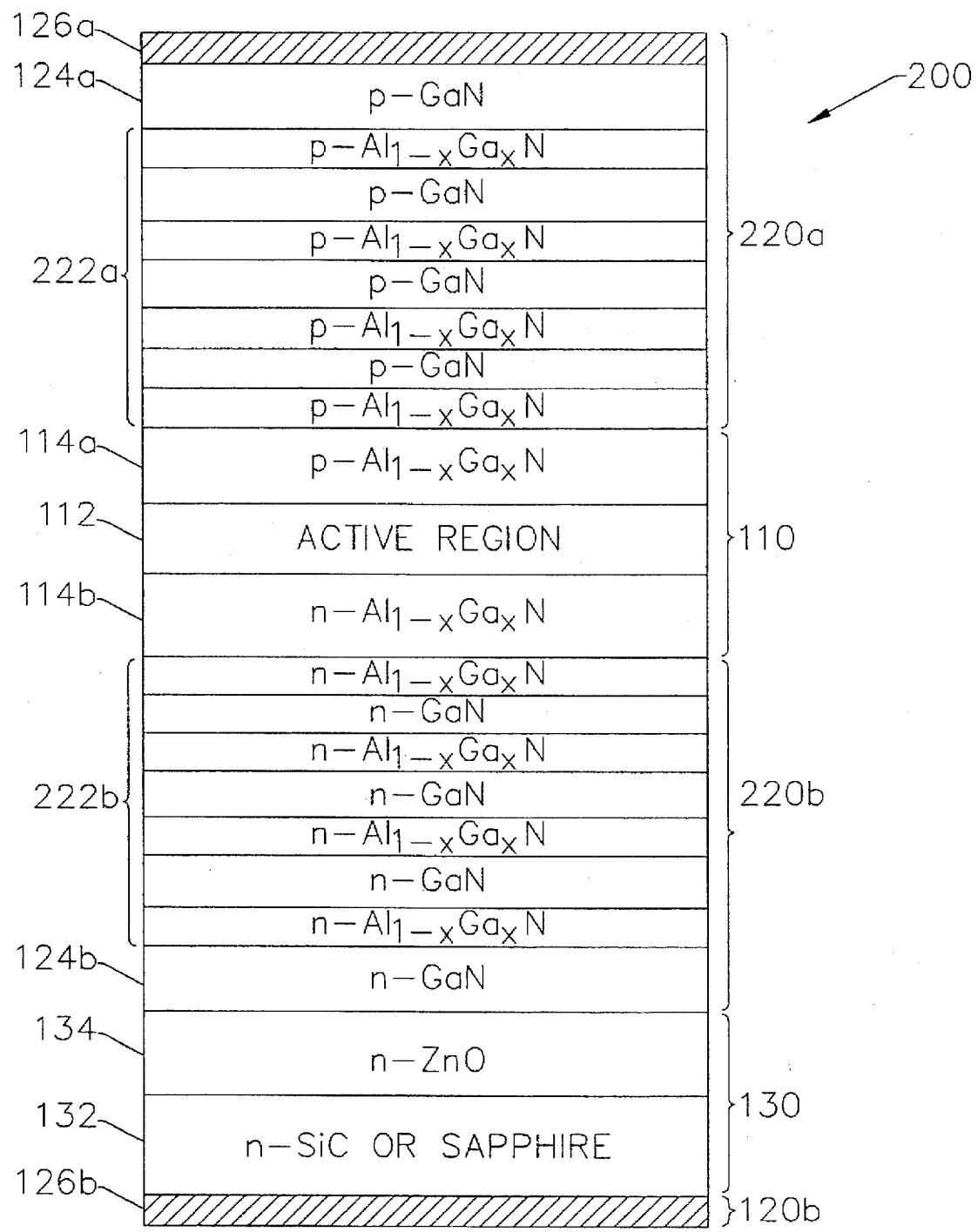
FIG. 5 is a cross-sectional illustration of a second embodiment of a Group III-V nitride compound semiconductor integrated heterostructure device.

FIG. 5 illustrates a second embodiment of an integrated heterostructure device according to the present invention. As shown in FIG. 5, integrated heterostructure device 200 includes a semiconductor device 110 formed of Group III-V nitride compound semiconductors, and two ohmic contacts 220a, 220b therefor. The semiconductor device 110 and the ohmic contacts 220 which together form the integrated heterostructure device are grown on a multicomponent platform 130.

For purposes of illustration, semiconductor device 110 of FIG. 5 is chosen to be identical to semiconductor device 110 shown in FIG. 3. That is, semiconductor device 110 shown in FIG. 5 is a double-heterojunction composed of $Al_{1-x}Ga_xN$ layers which form an LED optical emitter. Thus, the only difference between integrated heterostructure device 200 shown in FIG. 5 and integrated heterostructure device 100 shown in FIG. 3 are the ohmic contacts 220a and 220b. These ohmic contacts, which the present invention discloses as an additional type of ohmic contact suitable III-V nitride integrated heterostructure devices from the ohmic contacts 120a and 120b discussed above, will now be described in detail.

Referring to FIG. 5, an ohmic contact 220 may be formed on one or both of the $Al_{1-x}Ga_xN$ cladding layers 114a, 114b as required. The ohmic contact layer 220a, 220b includes a multiple quantum well (MQW) of alternating layers 222a, 222b of aluminum gallium nitride ($Al_{1-x}Ga_xN$) and gallium nitride (GaN) on the corresponding $Al_{1-x}Ga_xN$ cladding layers 114a, 114b. The alternating layers of 220a, 220b are doped the predetermined conductivity type. As shown in FIG. 5, the thickness of the layers GaN increase from adjacent the $Al_{1-x}Ga_xN$ cladding layers 114a, 114b to adjacent the GaN layers 124a, 124b. As also shown the thickness of the $Al_{1-x}Ga_xN$ layers in 220a, 220b remain constant across the entire MQW.

Figure 6A:
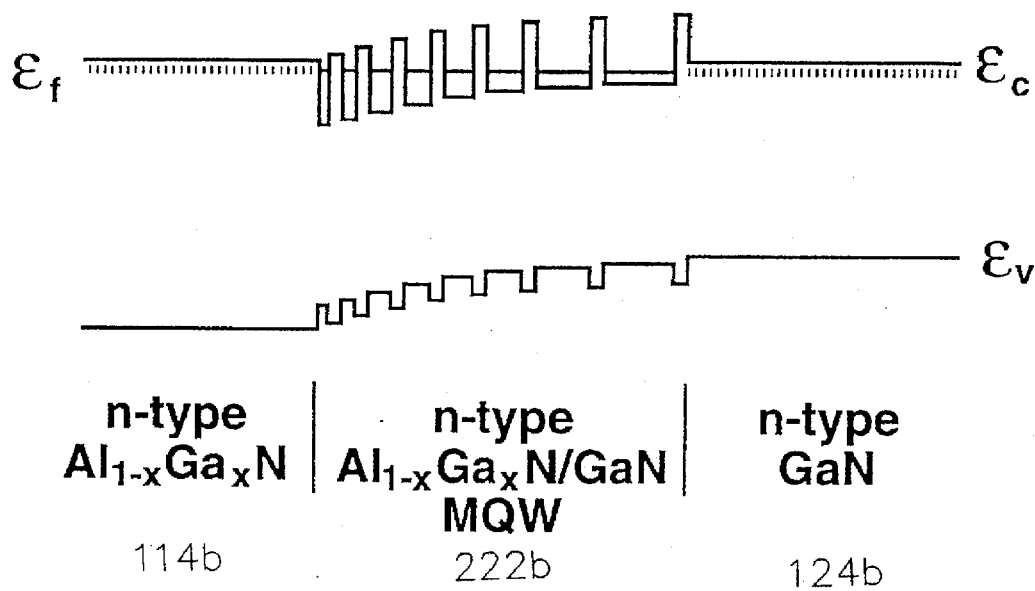
FIG. 6A an energy band diagram in which an n-type $Al_{1-x}Ga_xN/GaN$ multi quantum well structure is used to eliminate the conduction band offset between n-type $Al_{1-x}Ga_xN$ and n-type GaN.
Figure 6B:
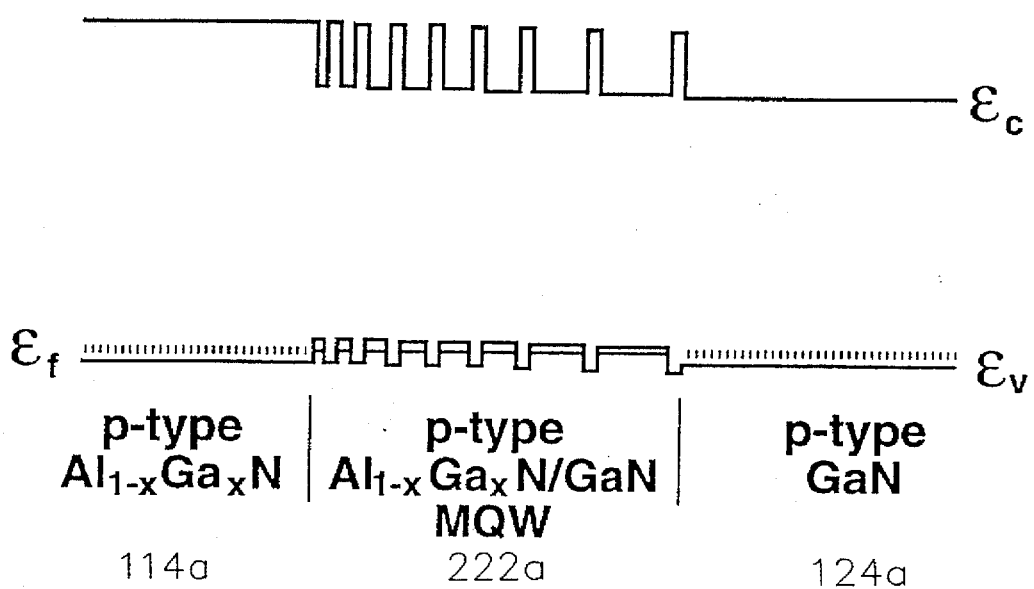
FIG. 6B is an energy band diagram in which a p-type $Al_{1-x}Ga_xN/GaN$ multi quantum well structure is used to eliminate the valence band offset between p-type $Al_{1-x}Ga_xN$ and p-type GaN.

As illustrated in FIG. 5, by increasing the thickness of the GaN layers in the 220a, 220b MQW, along with appropriate doping, the band offsets between the $Al_{1-x}Ga_xN$ cladding layers 114a, 114b and the GaN layers 124a and 124b which might otherwise impede the flow of carriers into the active region 112 of the device can be eliminated. This is illustrated by the energy band diagrams shown in FIGS. 6A and 6B. FIG. 6B shows the energy band diagram for the top p-type portion of the semiconductor device of FIG. 5 which illustrates how the MQW 222a, which is doped p-type, eliminates the valence band offset between the p-type $Al_{1-x}Ga_xN$ cladding layer 114a and the p-type GaN layer 124a. Similarly, FIG. 6A shows the energy band diagram for the bottom n-type portion of the semiconductor device of FIG. 5 which illustrates how the MQW 222b, which is doped n-type, eliminates the conduction band offset between the n-type $Al_{1-x}Ga_xN$ cladding layer 114b and the n-type GaN layer 124b.

Those skilled in the art will recognize that ohmic contact 220a, 220b of the present invention, which contains MQW layers 222a, 222b contrasts sharply with a known GaN/InN MQW ohmic contact for GaN wherein both types of layers in the MQW structure are of uniform thickness thereacross. The multiple quantum well structure of the present invention, which employs doped GaN quantum wells with increasing thickness as described above, operates as a "pseudo-graded" layer to eliminate the band offset between the $Al_{1-x}Ga_xN$ cladding layers 114a, 114b and the p-type GaN layers 124a and 124b of FIG. 5.

Figure 2:
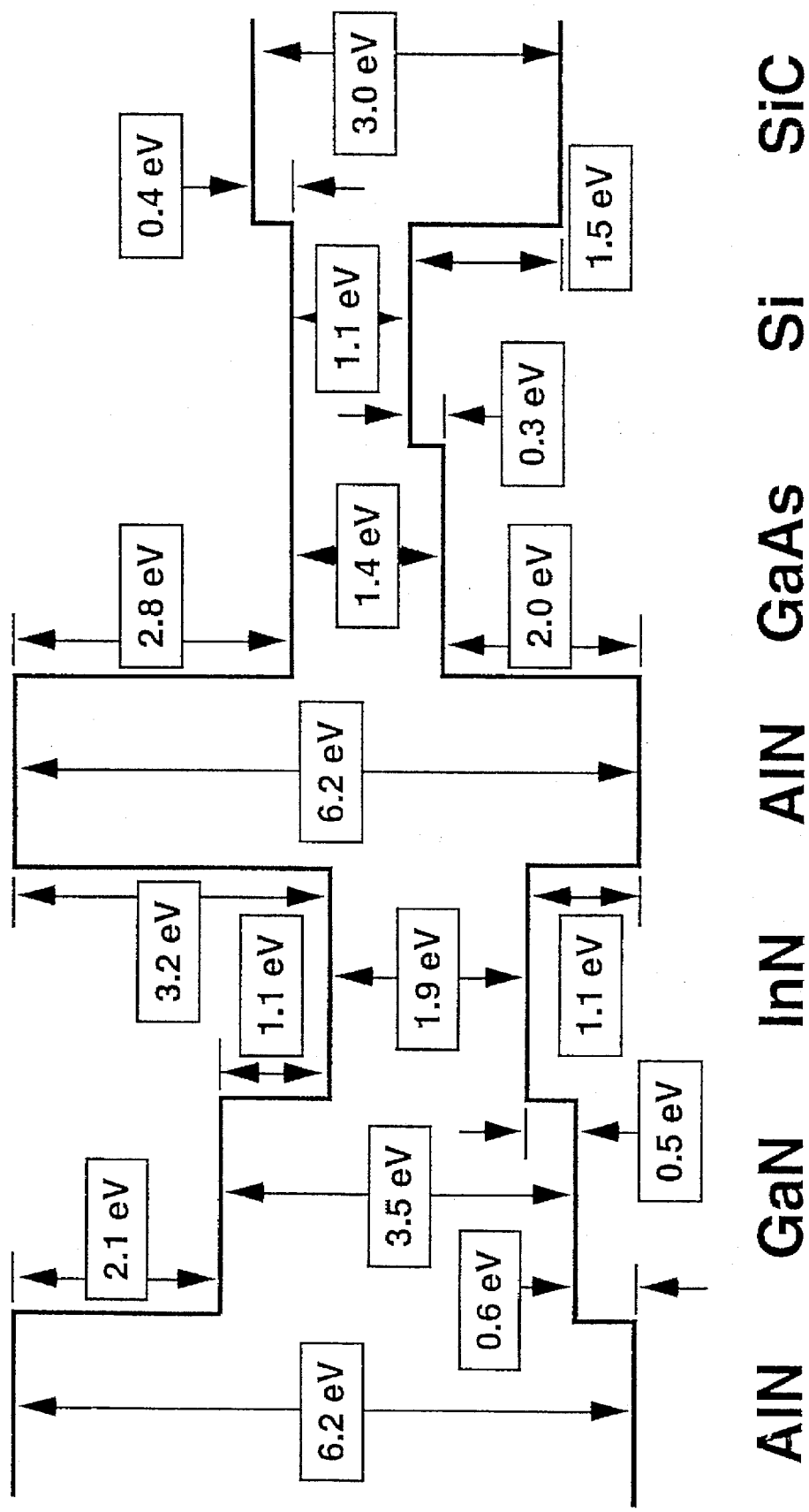
FIG. 2 an energy band diagram showing the band lineups AlN, GaN, InN, AlN, GaAs, Si, and SiC based on currently available experimental data known to the inventor.

Additional theoretical discussion of ohmic contacts according to the invention will now be provided. As illustrated from the energy band diagram of FIG. 2, there is a very large energy difference between the conduction bands of AlN and GaN ($\Delta E_c = 2.1$ eV) and between GaN and InN ($\Delta E_c = 1.1$ eV) As a consequence of this energy "barrier", electrons cannot easily flow from GaN into AlN, or from InN into GaN, even if these materials are heavily doped n-type, as is required in certain device applications. Energy barriers associated with each of the above heterointerfaces also exist with respect to the valence band of these materials, as shown in FIG. 2. Thus, the flow of holes from GaN into AlN, or from InN into GaN is also impeded.

The ohmic contacts of the present invention reduce or preferably eliminate the energy barriers to electron and/or hole flow in Group III-V nitride semiconductor devices. For example, referring to FIG. 3, according to the present invention, the energy barrier between the conduction band of $Al_{1-x}Ga_xN$ (first layer 114b) and the conduction band of GaN (third layer 124b) can be eliminated by using an intermediate $AL_{1-y}Ga_yN$ layer (second layer 122b) that is doped n-type and continuously graded from y=x at the $Al_{1-x}Ga_xN$ interface to Y=1 at the GaN interface. The n-type doping of the intermediate $AL_{1-y}Ga_yN$ layer maintains the Fermi level $\epsilon_f$ close to its conduction band as the grading material changes from $Al_{1-x}Ga_xN$ to GaN. By using the doped and graded material, the initial conduction band offset can be eliminated since the equilibrium Fermi energy $\epsilon_f$ must be constant throughout the entire heterostructure. A metal such as Al, In, Ti/Au or other suitable conductor can then be deposited onto the n-type GaN layer to provide an ohmic contact for the n-type $Al_{1-x}Ga_xN$ layer. Also, according to the present invention, additional $In_{1-x}Ga_xN$ graded layers having the appropriate conductivity type can be inserted between the GaN layers 124 and metal contact layers 126 to further improve the ohmic contact between the GaN layers 124 and metal layers 126. This type of grading using $In_{1-x}Ga_xN$ is illustrated in FIGS. 9 through 12.

According to the present invention, the energy barrier between the valence band of $Al_{1-x}Ga_xN$ (first layer 114a) and the valence band of GaN (third layer 124a) can also be eliminated by using an intermediate $Al_{1-y}Ga_yN$ layer (second layer 122) that is doped p-type and continuously graded from y=x at the $Al_{1-x}Ga_xN$ interface to x=1 at the GaN interface. The p-type doping of the intermediate $Al_{1-y}Ga_yN$ layer maintains the Fermi level $\epsilon_f$ close to its valence band as the grading material changes from $Al_{1-x}Ga_xN$ to GaN. By using the doped and graded material, the initial valence band offset can be eliminated since the equilibrium Fermi energy $\epsilon_f$ must be constant through the entire heterostructure. A metal 126 such as Au, Pt or other suitable conductor can then be deposited onto the p-type GaN layer to provide an ohmic contact for the p-type $Al_{1-x}Ga_xN$ layer. Also, according to the present invention, additional $In_{1-x}Ga_xN$ graded layers having the appropriate conductivity type can be inserted between the GaN layers 124 and metal contact layers 126 to further improve the ohmic contact between the GaN layers 124 and metal layers 126. This type of grading using $In_{1-x}Ga_xN$ is illustrated in FIGS. 9 through 12.

Alternatively, a pseudo-grading scheme of FIG. 4 may be employed using an AlGaN/GaN multiple quantum well (MQW) structure, to reduce or eliminate the conduction band offset between AlGaN and GaN. For pseudo-grading, the entire AlGaN/GaN MQW structure should be doped n-type with a suitable dopant and the width of the GaN quantum wells in the AlGaN/GaN multilayered structure should increase from the AlGaN interface to the GaN interface. Quantum confinement will then decrease the ground state energy level of each adjacent GaN quantum well as the well thickness increases.

Preferably, the GaN quantum well which is adjacent to the AlGaN layer should be a single monolayer in thickness (about 5 Å for basal plane growth) to provide the maximum increase in energy of the confined GaN. A sequence of GaN quantum wells beginning at the GaN interface having thicknesses of 10, 7, 5, 4, 3, 2, and 1 monolayers separated by about 15–25 Å AlN barriers is a representative embodiment of layer 222b. Other embodiments employing different layer thickness are also possible. The use of the varying thickness MQW reduces or eliminates the initial conduction band offset between AlGaN and GaN since, as before, the equilibrium Fermi energy $\epsilon_f$ must be constant throughout the entire multilayered heterostructure. The valence band offset between p-type AlGaN and p-type GaN can also be effectively reduced or eliminated according to the present invention, using p-type second layers.

The total thickness of the second layer 122, 222 should preferably be chosen such that it does not exceed the critical thickness for pseudomorphic film growth, beyond which misfit dislocations may form. Formation of misfit dislocations in heteroepitaxial growth is discussed by Matthews et al. in the three-part publication entitled *Defects in Epitaxial Multilayers*, Journal of Crystal Growth, Vol. 27, pp.118–125, 1974; Journal of Crystal Growth, Vol. 29, pp. 273–280, 1975; and Journal of Crystal Growth, Vol. 32, pp. 265–273, 1976. Additional analyses of misfit dislocations is contained in the paper by People et al. entitled *Calculation of Critical Layer Thickness versus Lattice Mismatch for $Ge_xSi_{1-x}/Si$ Strained Layer Heterostructures*, Applied Physics Letters, Vol. 47, pp. 322–324, 1985, in the paper by Tsao and Dodson entitled *Excess Stress and the Stability of Strained Heterostructures*, Applied Physics Letters, Vol. 53, pp. 848–850, 1988, and in the paper by Hu entitled Misfit Dislocations and Critical Thickness of Heteroepitaxy, Applied Physics Letters, Vol. 69, pp. 7901–7903, 1991.

Many other alternative formulations of the ohmic contacts according to the present invention may be provided. For example, the conduction band offset and/or valence band offset between InN and GaN can be eliminated by using continuously graded layers of $In_xGa_{1-x}N$. Alternatively, a pseudo-grading scheme may be employed using an AlN/GaN multilayered structure, to reduce or eliminate the conduction band offset between AlN and GaN. For pseudo-grading, the entire AlN/GaN multilayered structure should be doped n-type with a suitable dopant, and the width of the InN quantum wells in the GaN/InN multilayered structure should decrease from the GaN interface to the AlN interface for reasons identical to those discussed above. Those skilled in the art of semiconductor bandgap engineering will recognize the above pseudo-grading scheme to be fundamentally different from the technique described by Lin et al. in the publication entitled *Nonalloy Ohmic Contacts on GaN using InN/GaN Short-Period Superlattices*, Applied Physics, Letters, Vol. 64, pp. 2557–2559, 1994 which employs an InN quantum well of constant thickness.

The valence band offset between p-type GaN and p-type InN can also be effectively eliminated using ohmic contacts which are similar to those described above, except that the layers in the ohmic contact are doped p-type with a suitable dopant such as Mg. According to the present invention, appropriate ohmic contacts can also be designed and employed to eliminate band offsets between a variety of III-V nitride ternary and/or quaternary alloys such as between AlGaN and GaN, AlGaN and InGaN, AlGaN and InAlGaN etc.

FIGS. 7A–7C through 12A–12C show energy band diagrams which illustrate ohmic contacts between various combinations of Group III-V nitride layers.

A multicomponent platform according to the invention will now be described. Group III-V nitride materials and devices are grown on multilayer substrates such as sapphire or SiC using metalorganic chemical vapor deposition (MOCVD), vapor phase epitaxy (VPE), atomic layer epitaxy (ALE), or molecular beam epitaxy (MBE) by first depositing a nitride buffer layer, such as an AlN, an $AL_{1-y}Ga_yN$, or a GaN buffer layer onto the substrate to improve the nucleation and subsequent growth of the Group III-V nitride materials. See FIG. 13. As shown in FIGS. 14A and 14B, this known multilayer substrate produces appreciable conduction barriers, regardless of the thickness of the buffer layer, when AlN or $Al_{1-x}Ga_xN$ buffer layers are used in conjunction with an SiC bulk substrate (shown for layered structures of n-type GaN, AlN and SiC materials in FIGS. 14A and 14B as an example). As seen from FIG. 14A, if a thin (~20–200 Å) AlN buffer layer is employed, carriers transfer into the interfacial region of the GaN and SiC materials, leaving the thin AlN layer depleted. As a consequence, a very large barrier to electron transport between SiC and GaN results. If a thicker layer of n-type AlN is employed, substantial barriers to electron transport between SiC and GaN still occur, as shown by the energy band diagram of FIG. 14B. Similar barriers exist if AlGaN is used as a buffer layer between GaN and SiC. In addition, use of a GaN buffer layer on SiC leads to cracking effects.

According to the present invention, a non-nitride buffer layer in a multilayer platform is used for growth of III-V nitride materials and devices. The non-nitride buffer layer can be ZnO or any other compliant non-nitride material that satisfies the conditions of monocrystallinity, close-lattice-match to minimize misfit dislocations, and chemical/thermal compatibility with III-V nitride semiconductors (see Table I). MOCVD, ALE, MBE or other deposition techniques known to those skilled in the art of thin film growth can be used to deposit the non-nitride buffer layer. In a preferred embodiment of the invention, molecular beam epitaxy (MBE) is used to grow a non-nitride buffer layer of ZnO on a SiC substrate, followed by MBE growth of a III-V nitride IHD. The multilayer substrate of the present invention significantly decreases conduction barriers as shown in FIGS. 15, 16A and 16B.

Figure 15:
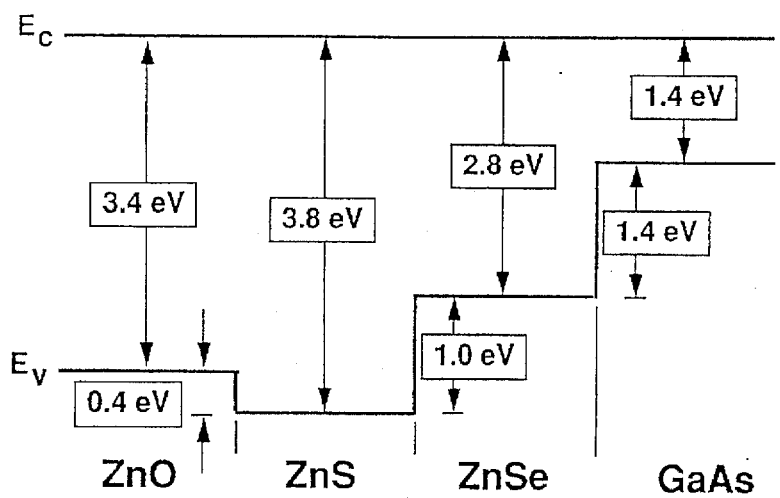
FIG. 15 is an energy band diagram showing the band lineup of ZnO, ZnS, ZnSe, and GaAs.
Figure 16A:
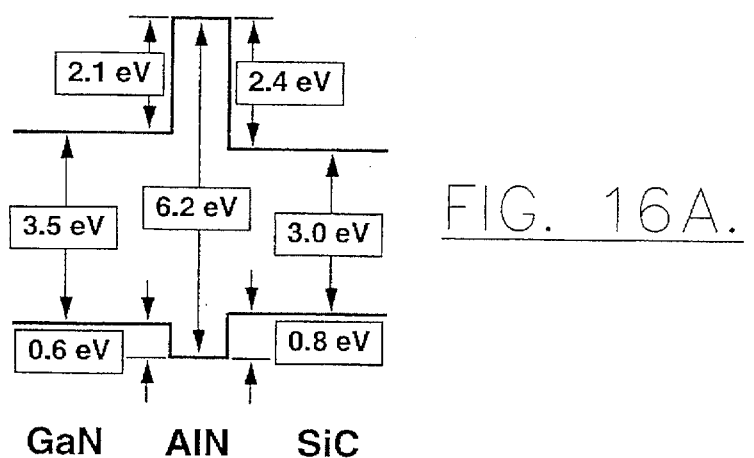
FIGS. 16A and 16B illustrate energy band diagrams of band for GaN/AlN/SiC and GaN/ZnO/SiC heterostructures in which thin AlN and ZnO layers are used.
Figure 16B:
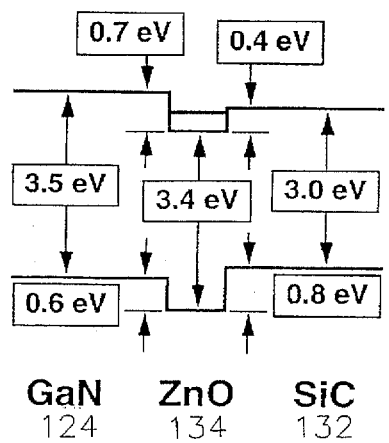

FIG. 15 shows known band offsets for GaAs, ZnSe, and ZnS. Note that the conduction bands of these materials exhibit little or no energy offset, enabling electrons to flow freely between these three materials. ZnSe and ZnS follow the common cation rule which states that there is little or no conduction band offset between II-VI materials that have a common cation (in this case Zn). This empirical rule has been extended in FIG. 15 to include ZnO. Thus, we are able to estimate the band offsets between ZnO and GaAs. Consistent with the band diagrams of FIG. 2, we can then estimate the band offsets between SiC, ZnO, and GaN which are illustrated by the band diagrams of FIG. 16B. Note that, using this procedure, the ZnO conduction band is estimated to be within about 0.4 eV of the conduction band of SiC and within ~0.7 eV of the conduction band of GaN. As a consequence, on the basis of the estimate, transport of electrons from SiC into GaN via a thin layer of ZnO, as shown in FIG. 16B, may be expected to occur with a much smaller energy barrier to surmount compared to electron flow through a SiC/AlN/GaN heterointerface (see FIG. 16A).

Referring back to FIG. 3 and FIG. 5, integrated heterostructure device 100, 200 further includes a multicomponent platform 130. Substrate 132 is preferably monocrystalline and most preferably is conducting. Substrate 132 is generally on the order of 0.1 to 1.0 mm in thickness. Accordingly, concerning currently available substrates for III-V nitride epitaxial growth, although sapphire or silicon may be used for substrate 132, conductive silicon carbide is most preferably used. Multicomponent platform 130 also includes buffer layer 134 on substrate 132. Buffer layer 134 may comprise GaN, AlN, InN or an alloy thereof deposited using established techniques of current practice by those skilled in the art. However, according to the present invention, it is preferred that the buffer layer 134 be a non-nitride compliant monocrystalline material which allows monocrystalline Group III-V nitride compound semiconductor materials to be formed thereon.

Recently, compliant substrate technologies have been demonstrated for Si:Ge as described in the publication by A. R. Powell et al. entitled "New Approach to the Growth of Low Dislocation Relaxed Si:Ge Materials", Applied Physics Letters, Vol. 64, pp. 1856–1858, 1994 and for II-VI alloy semiconductors as described in the publication by T. Chu et al. entitled "The Role of Barium in the Heteroepitaxial Growth of Insulators and Semiconductors on Silicon", Materials Research Society Symposium Proceedings, Vol. 334, pp. 501–506 (1994). The basic idea behind this approach is to force the misfit dislocations associated with non-lattice-matched heteroepitaxy down into a very thin compliant layer rather than permitting the defects to propagate upwards into the epitaxial overlayer of interest. In this way, the material of interest can be grown with much lower dislocation density.

Most preferably, according to the present invention, buffer layer 134 comprises a layer of monocrystalline zinc oxide that is typically 20 Å to 30,000 Å thick. In particular, zinc oxide has several desirable properties for use as a compliant buffer layer between base substrate 132 and the III-V nitride integrated heterostructure device of FIG. 3 comprised of layers 120b, 110, and 120a. Zinc oxide has a hexagonal crystal structure with lattice constants (c=5.213 angstroms, a=3.249 angstroms) and thermal expansion coefficients ($\Delta a/a=4.8\times10^{-6}$ at 300° K.; $\Delta a/a=8.3\times10^6$ at 800° K.) comparable to those of the III-V nitrides. Its band gap at 300° K. is 3.3 eV. Although zinc oxide is softer than the III-V nitrides, it is one of the most tightly bound of the wide-band-gap II-VI materials. As a consequence, it has a very high melting point (1975° C.) and its surface is stable with respect to sublimation at temperatures up to at least 900° C. High-quality bulk crystals of zinc oxide are not currently available. In addition, because of its high sublimation and melting temperatures, sputtering is currently the preferred technique to prepare zinc oxide films for use in transparent conductor applications. Growth of zinc oxide by molecular beam epitaxy (MBE) using a compound zinc oxide vapor source has never before been demonstrated, to the best of the inventor's knowledge, because of the high sublimation/melting points of this material. Also, MBE growth of zinc oxide using elemental zinc and oxygen sources has not been possible due to the lack of a suitable source of oxygen that is compatible with the molecular beam epitaxy growth process.

Figure 17A:
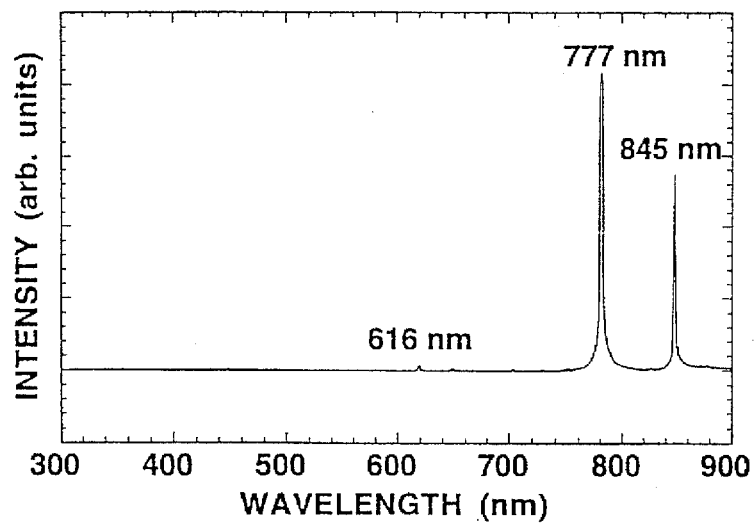
FIGS. 17A–17C illustrate optical emission spectra for an oxygen plasma source which is operating in a molecular beam epitaxy chamber to grow zinc oxide by molecular beam epitaxy.
Figure 17B:
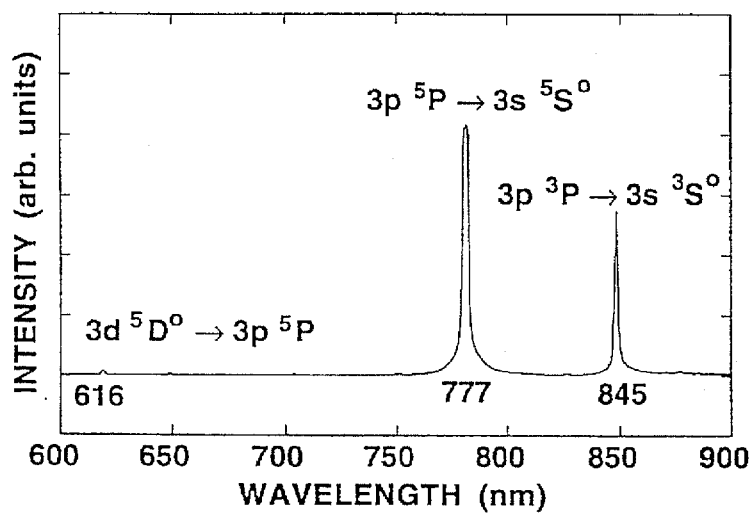
Figure 17C:
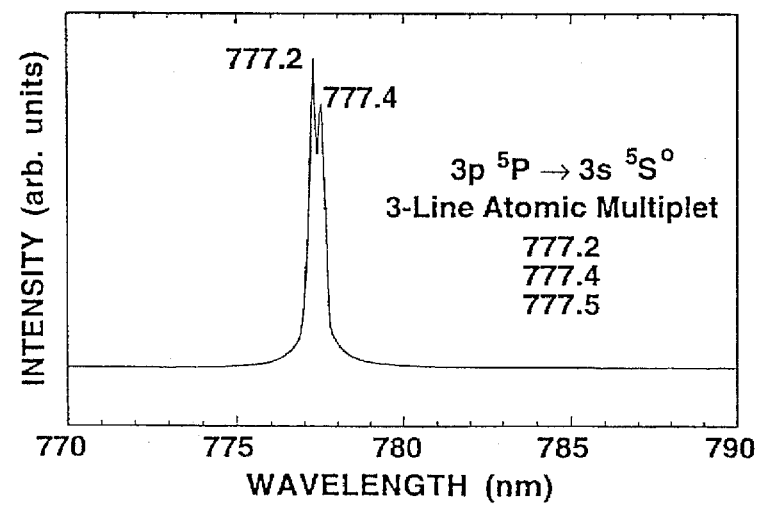

According to the present invention, monocrystalline zinc oxide is grown by molecular beam epitaxy. According to the present invention, zinc oxide can be grown using a standard MBE effusion cell filled with zinc and an MBE-compatible oxygen plasma source which is used to convert molecular oxygen flowing into the plasma source into atomic oxygen which impinges onto a substrate, along with zinc atoms from the MBE effusion cell, for growth of zinc oxide. FIGS. 17A–17C show optical emission spectra taken while the oxygen plasma source (an Oxford Applied Research model MPD21 rf plasma source available commercially from Oxford Applied Research, Crowley Mill, Witney, Oxfordshire OX8 STJ, England) is operating in the MBE chamber. The spectrum from 300 nm to 900 nm shows strong atomic oxygen emission lines at 777 and 845 nm. The high-resolution spectra show conclusively that the observed emission peaks are due to atomic oxygen, specifically $3p^3P \rightarrow 3s_3S°$ transitions at 777.2, 777.4 and 777.5 nm and a $3p^5P \rightarrow 3s_5S°$ transition at 844.6 nm. The small feature at 616 nm is also due to emission from atomic oxygen, specifically $3d^5D° \rightarrow 3p^5P$ transitions. No evidence of molecular oxygen is present in the optical emission spectra of FIGS. 17A–17C, which would be signaled by band head emission peaks in the 300 to 400 nm region. Atomic oxygen is highly reactive and is essential for growth of high-quality zinc oxide by MBE.

These experimental spectra provide compelling evidence that the MBE-compatible oxygen plasma source is very effective in converting molecular oxygen into atomic oxygen. This result is not unique to the Oxford Applied Research plasma source. Those skilled in the art will recognize that MBE-compatible rf plasma sources from other vendors and MBE-compatible electron-cyclotron-resonance (ECR) plasma sources can also be used to generate atomic oxygen.

Figure 18A:
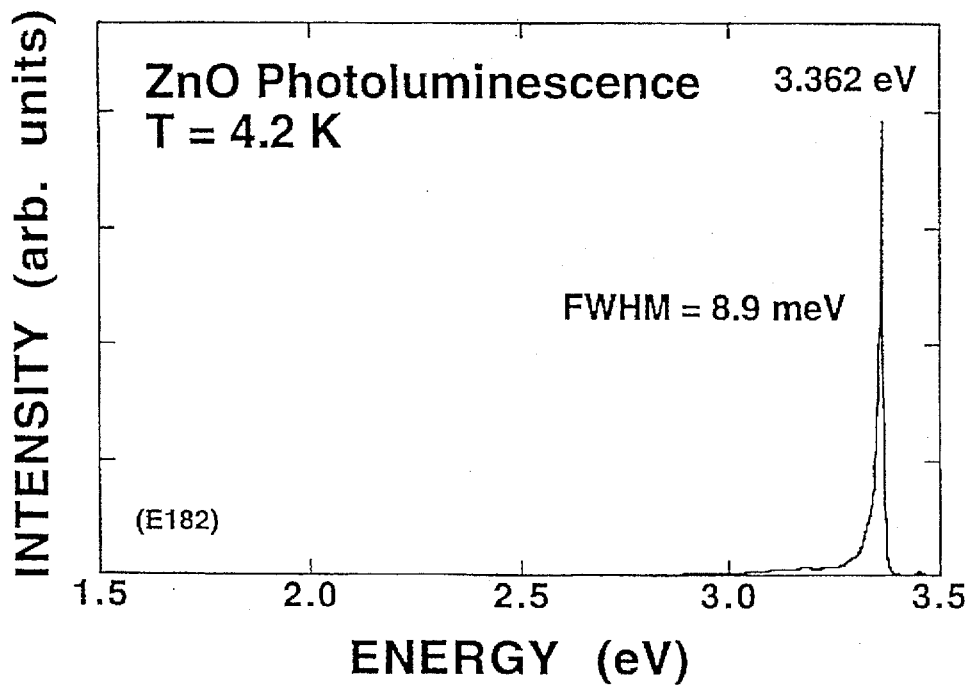
FIGS. 18A–18B illustrate the results of photoluminescence measurements of MBE-grown zinc oxide.
Figure 18B:
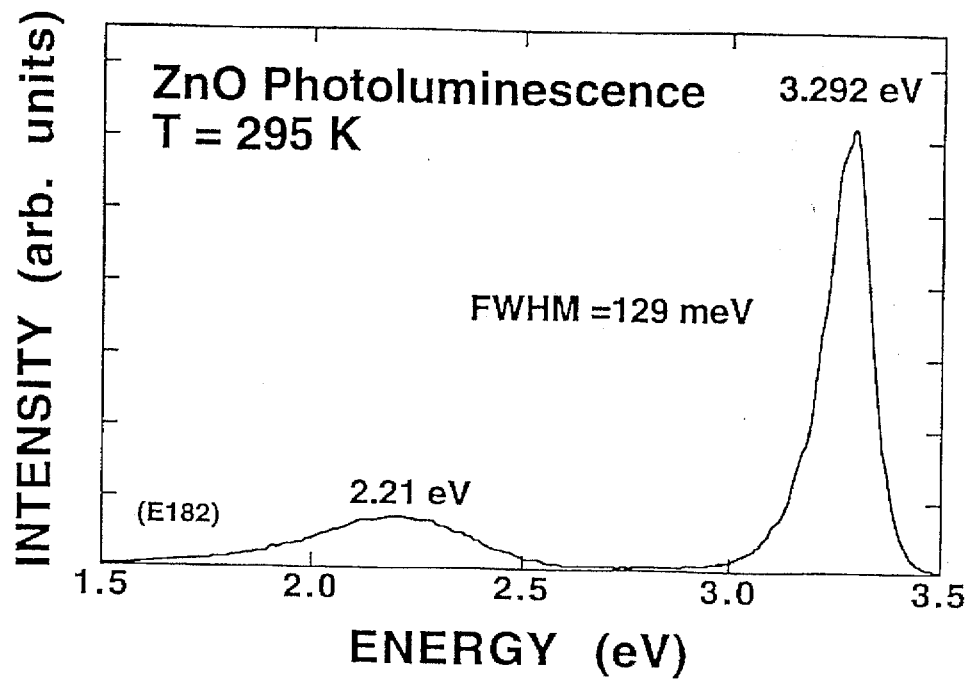

Monocrystalline growth of zinc oxide has been achieved on sapphire, silicon carbide and gallium nitride-on-silicon carbide substrates. Substrate temperatures for growth of zinc oxide ranged from 300–900° C. Growth rates of $\geq 0.2$ μm/hr are obtained using the oxygen plasma source described above. The monocrystalline zinc oxide films appear specular and transparent to the eye. As deposited zinc oxide films are n-type. Hall measurements yield carrier concentrations of $2 \times 10^{19}$ cm$^{-3}$ and mobilities of 260 cm$_2$/V-s—comparable to the best bulk ZnO. Photoluminescence at 295° K. is dominated by edge emission at 3.292 eV, as shown in FIGS. 18A–18B. At 4.2° K., the photoluminescence from MBE-grown zinc oxide consists of a single sharp peak at 3.362 eV (full-width-at-half-maximum=8.9 meV) which is presumably due to bound exciton emission. The photoluminescence results provide clear evidence of the excellent optical properties of the MBE-grown zinc oxide films.

Additional evidence of the structural quality of MBE-grown zinc oxide films is provided by reflection high energy electron diffraction studies (RHEED) performed in situ in ultra high vacuum during the MBE film growth experiments. Those skilled in the art recognize that RHEED patterns can be used to distinguish three-dimensional island-type MBE film growth from the preferred flat two-dimensional growth necessary for many device structures (lasers, LEDs, transistors, etc.). In particular, three-dimensional monocrystalline film growth is signaled by RHEED patterns that consist of a series of regularly-shaped spots, whereas two-dimensional monocrystalline film growth gives rise to RHEED patterns which consist of a series of parallel lines.

Figure 19A:
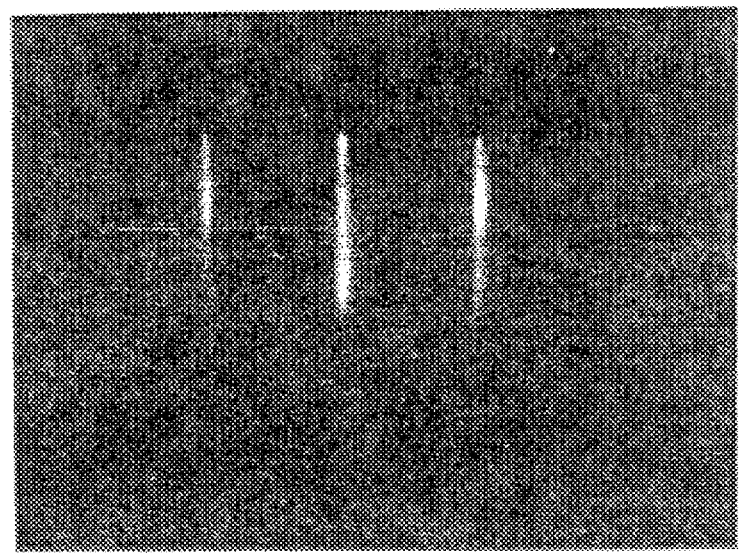
FIGS. 19A–19B illustrate RHEED Patterns for a zinc oxide film grown by MBE on a basal plane sapphire substrate.
Figure 19B:
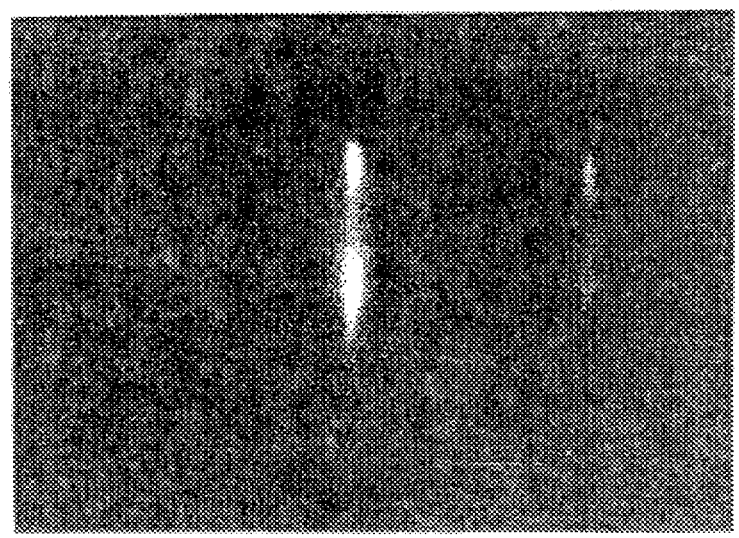
Figure 20A:
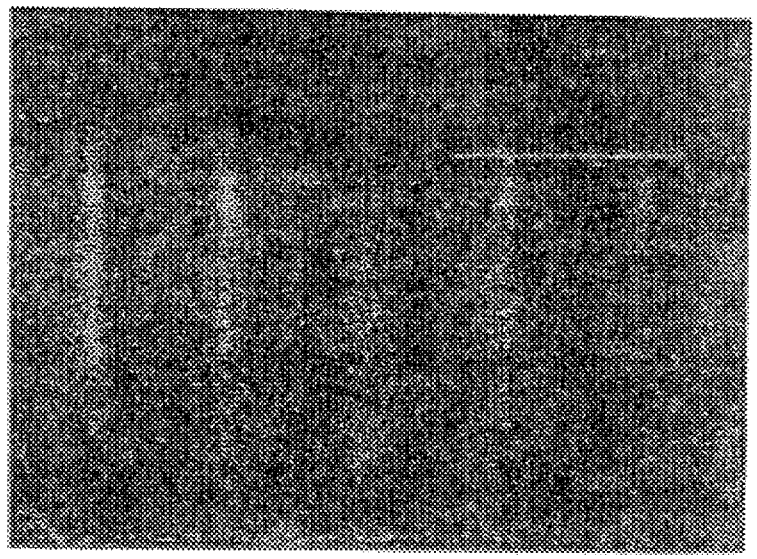
FIGS. 20A–20B illustrate RHEED patterns for a zinc oxide film by MBE onto an n-type silicon carbide substrate.
Figure 20B:
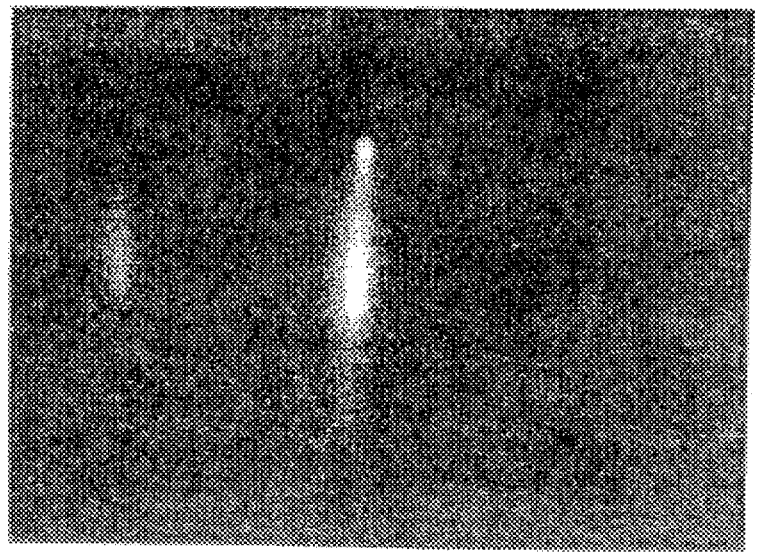
Figure 21A:
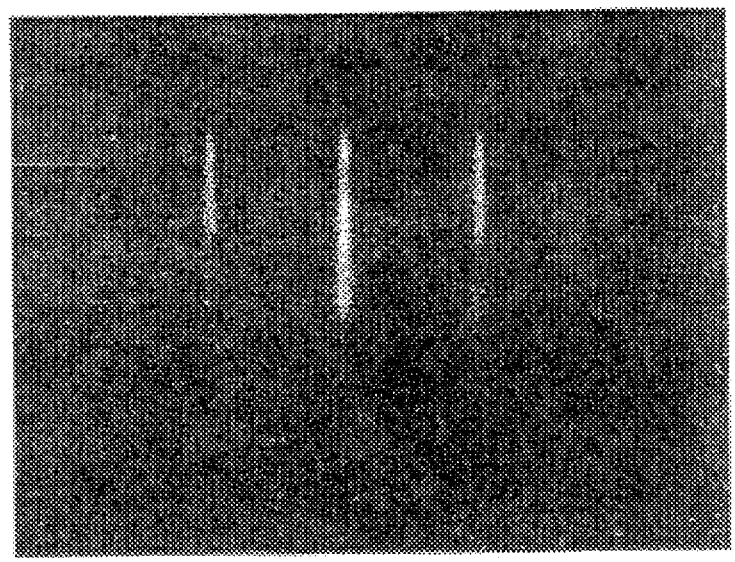
FIGS. 21A–21B illustrate RHEED patterns for a monocrystalline zinc oxide film grown on n-type gallium nitride.
Figure 21B:
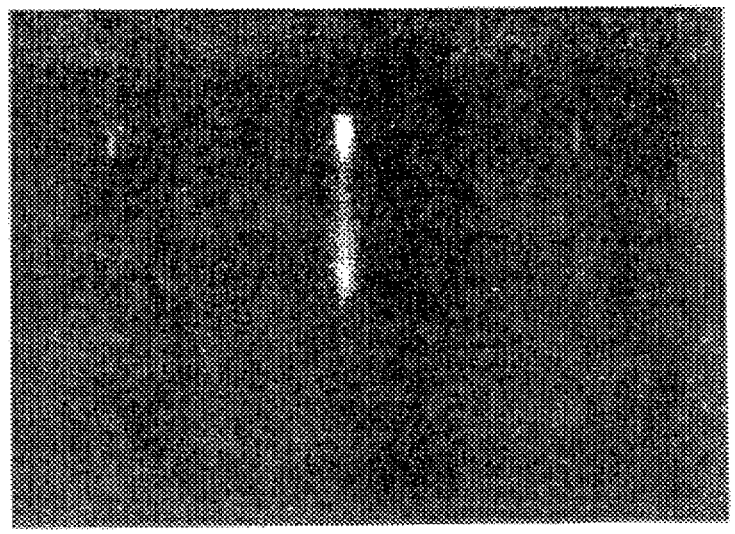

Photographs of RHEED patterns obtained for MBE-grown zinc oxide films are shown in FIGS. 19A, 19B, 20A, 20B, 21A and 21B. FIGS. 19A–19B show RHEED patterns for a zinc oxide film grown by MBE on a basal-plane sapphire substrate which consist of a series of sharp parallel lines. The RHEED patterns were obtained with the electron beam directed along two different crystal directions in the basal plane, as indicated by the crystal directions listed in the figure. Those skilled in the art will recognize the RHEED patterns of FIG. 19A–19B to be indicative of high-quality two-dimensional film growth. FIGS. 20A–20B show RHEED patterns obtained for a zinc oxide film grown by MBE onto an n-type silicon carbide substrate. Again, the streaky RHEED pattern, consisting of a series of parallel lines, clearly shows that two-dimensional growth of zinc oxide on silicon carbide has been achieved using the MBE growth techniques described above. Finally, FIGS. 21A–21B show RHEED patterns indicative of high-quality two-dimensional monocrystalline growth of zinc oxide on n-type gallium nitride. In this case, the zinc oxide film was grown onto a 3 μm thick monocrystalline gallium nitride film which was deposited onto a bulk silicon carbide substrate.

Figure 22A:
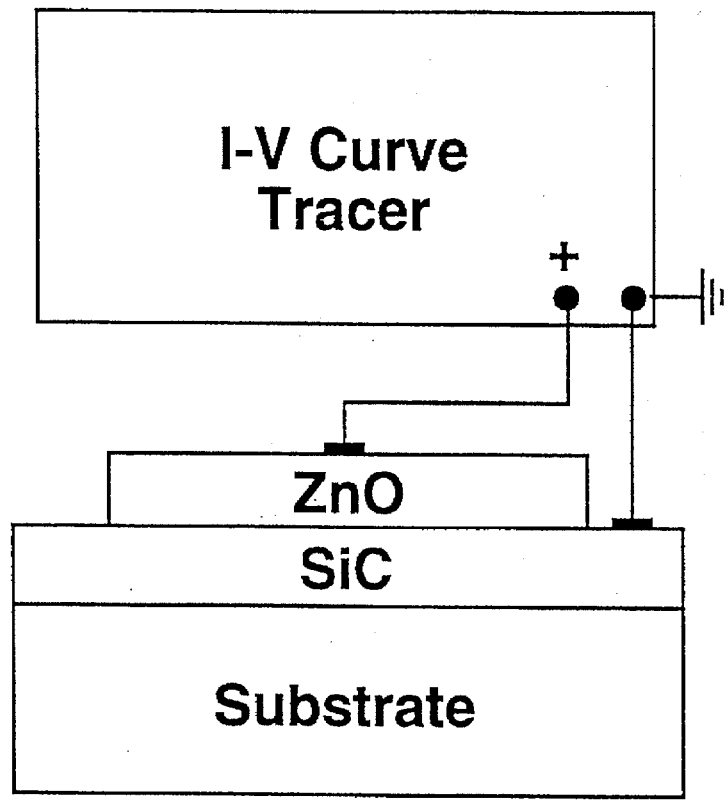
FIGS. 22A and 23A illustrate experimental configurations for measuring current-voltage curves of a zinc oxide layer grown on a silicon carbide layer and on a gallium nitride layer respectively.
Figure 23A:
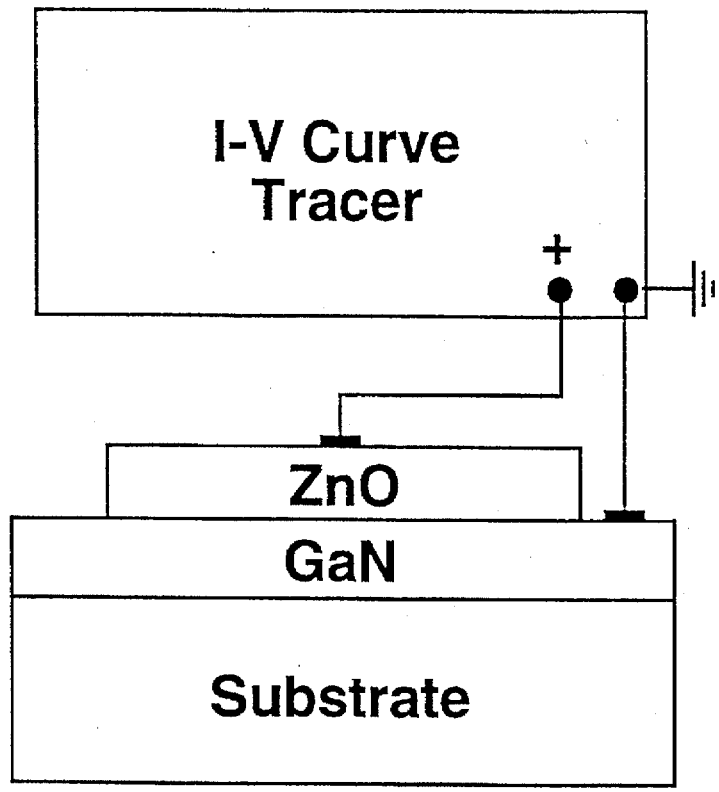

In order to study the electrical properties of zinc oxide/silicon carbide and zinc oxide/gallium nitride heterointerfaces, portions of the zinc oxide films whose RHEED patterns are shown in FIGS. 20A–20B and 21A–21B were etched away to expose the underlying layer (silicon carbide or gallium nitride, respectively). Electrical properties of these heterointerfaces were measure with a commercial curve tracer, using the experimental configuration shown in FIGS. 22A and 23A.

Figure 22B:
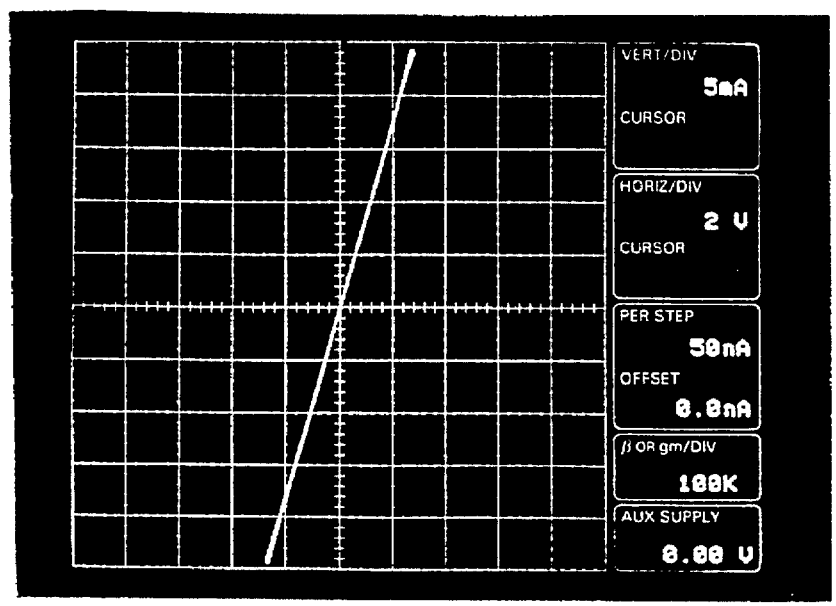
FIGS. 22B and 23B illustrate the current-voltage curves corresponding to FIGS. 23A and 23B respectively.

FIG. 22B shows the current-voltage (I-V) characteristic of an n-type zinc oxide/n-type silicon carbide heterointerface. It is seen that the I-V characteristic is linear, indicating that there is no substantial energy barrier ($\geq 0.3$ eV) between the conduction band of n-type zinc oxide and the conduction band of n-type silicon carbide. This result is reasonably close to the estimate of the band offsets between zinc oxide and silicon carbide that was presented earlier based on the common cation rule for wide bandgap II-VI materials—the conduction band offset between zinc oxide and silicon carbide may even be less than the 0.4 eV offset estimated.

Figure 23B:
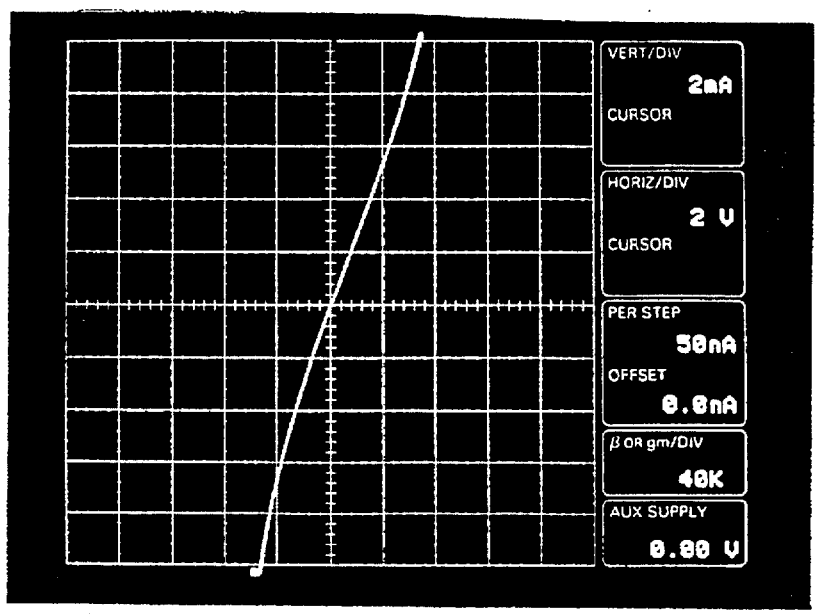

FIG. 23B shows the current-voltage (I-V) characteristics of an n-type zinc oxide/n-type gallium nitride heterointerface. It is seen that the I-V characteristic is nearly linear, implying that the conduction band offset between zinc oxide and gallium nitride is not very large, probably even less than the 0.7 eV offset estimated from the empirical common cation rule. This result provides experimental evidence that electrons can flow relatively freely between n-type zinc oxide and n-type gallium nitrides consistent with the conduction band offset estimated on the basis of the empirical common cation rule for II-VI materials. According to the present invention, the conduction band offset between GaN and ZnO, although relatively small, can be completely eliminated using an $In_{1-x}Ga_xN$ grading layer between the GaN and ZnO layers, as has been described previously.

Figure 24:
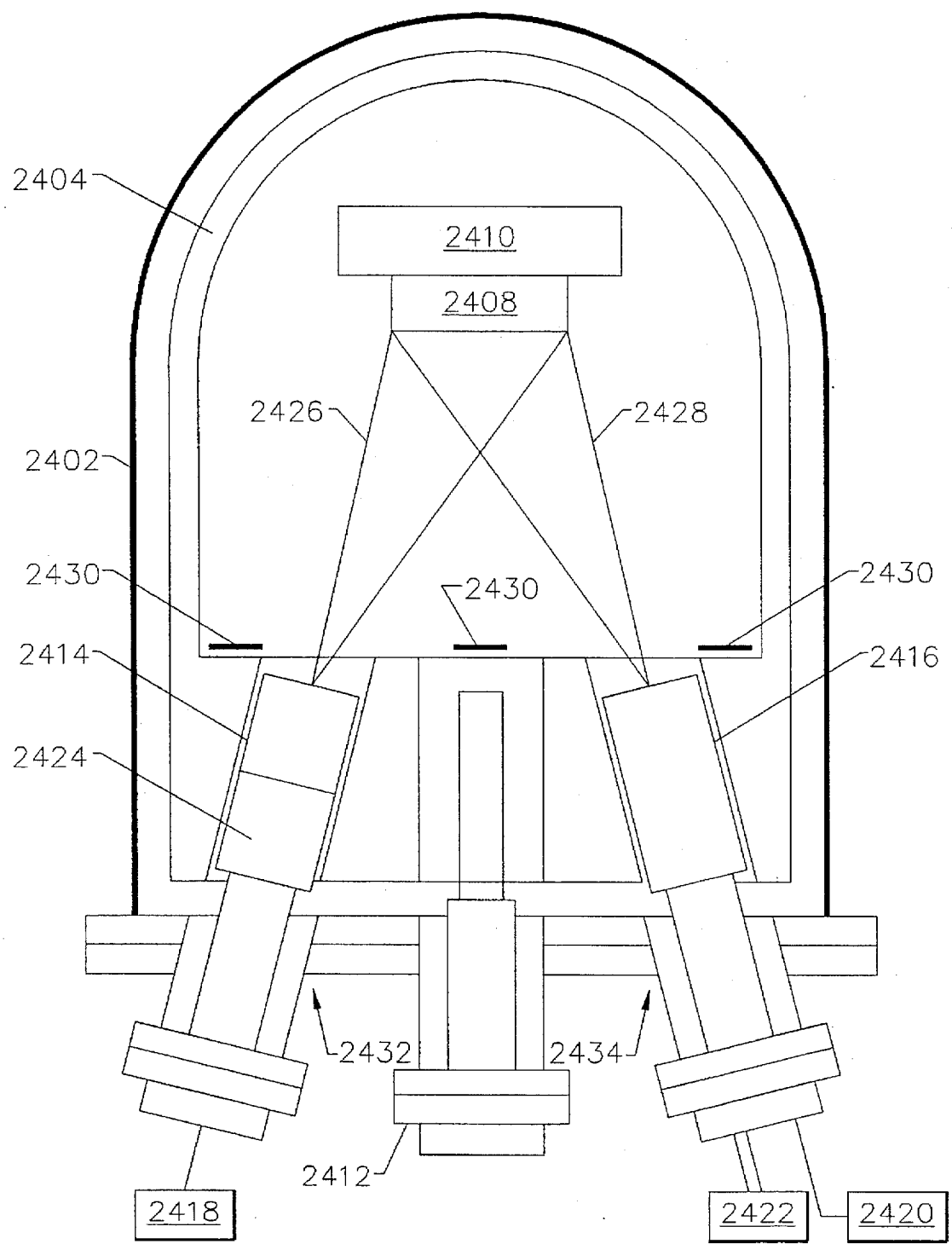
FIG. 24 schematically illustrates a molecular beam epitaxy (MBE) system which may be used for growing zinc oxide and other oxides according to the present invention.

Referring now to FIG. 24, a detailed description of a molecular beam epitaxy (MBE) system for growing zinc oxide according to the present invention will now be described. As shown in FIG. 24, the MBE system includes an MBE chamber 2402, typically stainless steel. An external ultra-high vacuum (UHV) pump evacuates the MBE chamber to maintain the chamber at ultrahigh vacuum. Liquid nitrogen shrouding 2404 is used to provide cold surfaces within the MBE chamber to further reduce unwanted contaminants. The substrate 2408 is mounted on a heated substrate holder 2410. Substrate holder 2410 is maintained at a selected temperature for MBE film growth by an external power supply not shown. An optical pyrometer 2412 is shown for measuring the substrate temperature. Other conventional temperature measuring systems, such as a thermocouple attached to the substrate holder 2410 or other temperature probes can also be used to measure the substrate temperature.

Still referring to FIG. 24, the MBE system is equipped with two MBE source flanges 2432 and 2434 respectively. An MBE source for molecular zinc 2424 and an MBE source for molecular oxygen 2416 are mounted on flanges 2432 and 2434 respectively. Shutters 2430 are used to open and close the inlets for the zinc MBE effusion furnace 2414, oxygen plasma source 2416 and pyrometer 2412.

The zinc source 2414 comprises a standard MBE effusion furnace that is loaded with zinc metal 2424. An external power supply 2418 is used to heat the zinc furnace 2414 to a desired temperature, thereby generating a vapor flux of zinc atoms 2426 within the MBE chamber from zinc metal source 2424, by sublimating or melting the zinc metal.

An oxygen plasma source 2416 is mounted on the second MBE source flange 2434. Oxygen plasma source 2416 is equipped with an external source of high purity molecular oxygen gas 2422. The molecular oxygen is fed into the plasma source 2416 using a suitable valve, not shown in FIG. 24. An oxygen plasma is maintained within the source using an external rf matching network and power supply 2420. A flux of highly reactive oxygen atoms 2428 is emitted from the plasma source 2416. At the substrate 2408, which may be silicon carbide, sapphire or other suitable monocrystalline material, zinc atoms and oxygen atoms combine to form monocrystalline zinc oxide.

It will be understood by those having skill in the art that additional MBE source ports can be added to the system shown in FIG. 24 for MBE deposition of other materials including dopants for the zinc oxide. It will also be understood by those having skill in the art that materials other than zinc oxide can be grown by MBE using an oxygen plasma source 2416 and appropriate vapor phase precursors of the monocrystalline oxide. For example, other monocrystalline oxide-based material including magnesium oxide, indium oxide, indium-tin oxide, aluminum oxide and silicon-based oxides may be grown using oxygen plasma source 2416. Moreover, high temperature (high $T_c$) superconductors may be grown using oxygen plasma source 2416. For example, oxide-based superconductors, such as yttrium-barium-copper-oxide ($YBa_2Cu_3O_{1-7}$), may be grown.

Figure 25A:
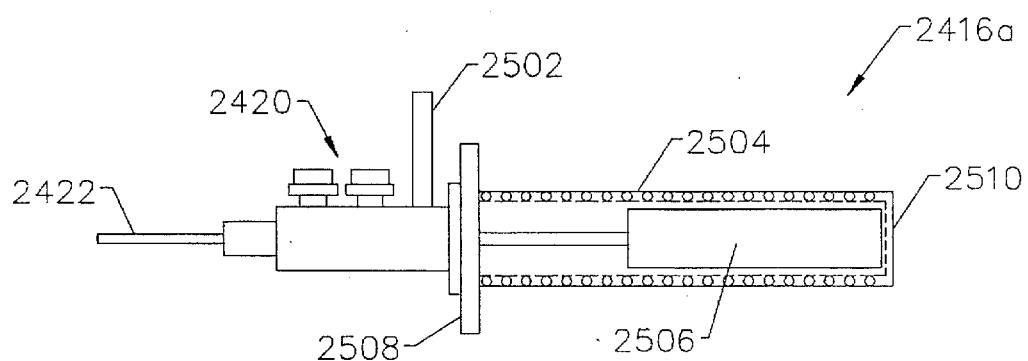
FIGS. 25A and 25B illustrate first and second embodiments of MBE-compatible molecular oxygen sources which may be used with the system of FIG. 24
Figure 25B:
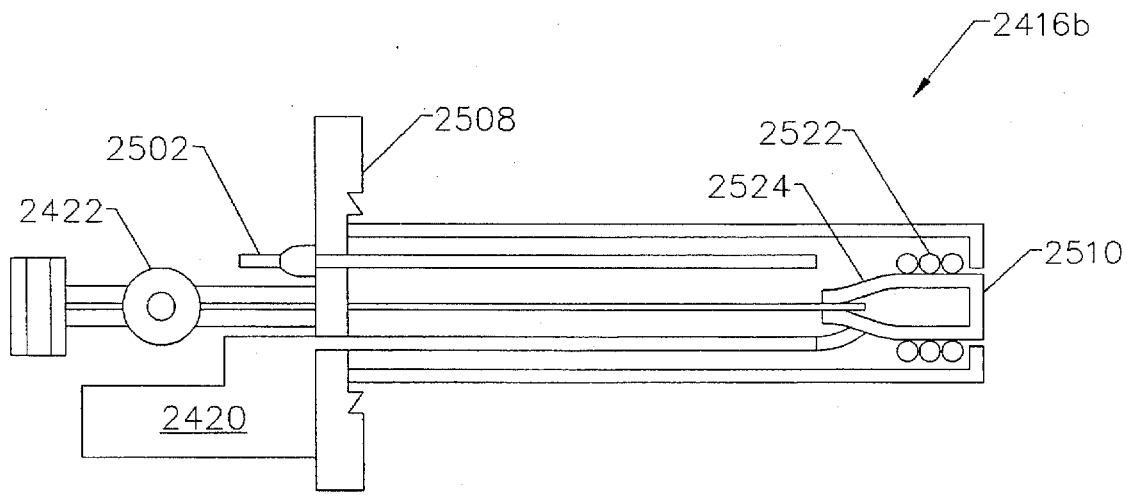

Referring now to FIGS. 25A–25B, first and second embodiments, respectively, of molecular oxygen sources which may be used to grown zinc oxide according to the present invention are illustrated. FIG. 25A illustrates an electron cyclotron resonance (ECR) plasma source, such as an MBE-compatible compact plasma source marketed by ASTeX Applied Science and Technology, 35 Cabot Road, Woburn, Mass. 01801. FIG. 25B illustrates a radio frequency (rf) plasma source, such as the Oxford Applied Research Model MPD 21 source described above.

Referring to FIG. 25A, the ECR plasma source 2416a includes a power supply input 2420 for supplying microwave power and magnet current to plasma source 2416a. An oxygen gas inlet 2422 is also provided. A water cooling inlet 2502 provides cooling water for the source. The magnet current provides current to magnet coil 2504 to produce electron cyclotron resonance in a manner well known to those having skill in the art. A liner 2506 prevents the plasma from contaminating magnet coils 2504. An ultra high vacuum flange 2508 is designed to bolt directly onto a 4½" diameter MBE source flange. The ECR source thereby maintains a microwave plasma for converting the molecular oxygen in gas inlet 2422 to atomic oxygen at source aperture 2510 to provide atomic oxygen beam 2428 (FIG. 24).

FIG. 25B schematically illustrates the Oxford rf plasma source 2416b. Source 2416b is equipped with an ultra-high vacuum flange 2508 as described above. Water cooling inlet 2502 is also provided, as well as a gas inlet 2422. A power supply 2420 provides rf power to rf shield 2520. Water cooled rf coil 2522 produces an rf plasma in discharge tube 2524 to produce an atomic oxygen beam 2428 at exit plate 2510. It will be understood by those having skill in the art that other MBE-compatible sources of molecular oxygen may be used. For example, an MBE-compatible rf plasma source model RF-4.5 is available from SVT Associates, Inc., 7620 Executive Drive, Eden Prairie, Minn. 55344, USA, that can also be used to generate oxygen atoms.

Figure 26:
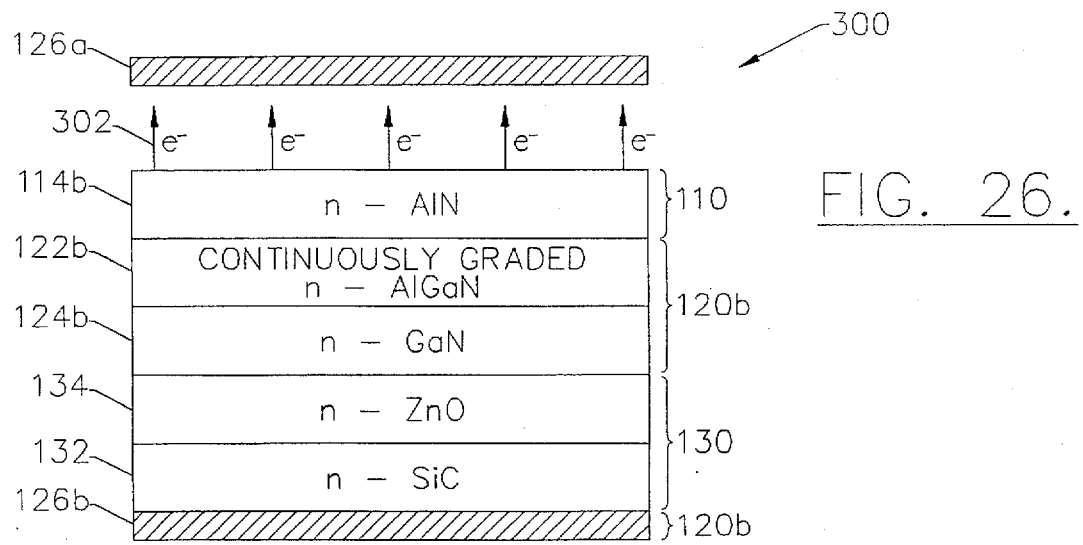
FIG. 26 is a cross-sectional illustration of an AlN electron emission device according to the present invention.

FIG. 26 illustrates a third embodiment of an integrated heterostructure device according to the present invention.

Referring to FIG. 26, integrated heterostructure device 300 forms a Group III-V nitride compound semiconductor electron emitter for emitting electrons 302 in vacuum. As shown, only a single ohmic contact 120b is provided which contains layer 122b, a graded n-type $Al_{1-x}Ga_xN$ layer which provides an ohmic contact between n-type GaN 124b and n-type AlN 114b.

Figure 7A:
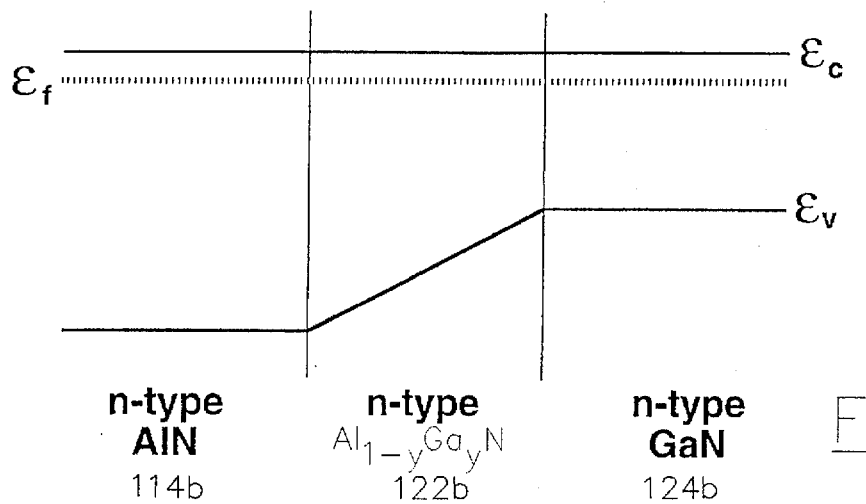
FIGS. 7A–FIGS.7C through FIGS. 12A–12C are energy band diagrams in which graded ternary Group III-V nitrides or pseudograded Group III-V nitride multi-quantum well structures are used to eliminate band offsets between other nitrides.
Figure 7B:
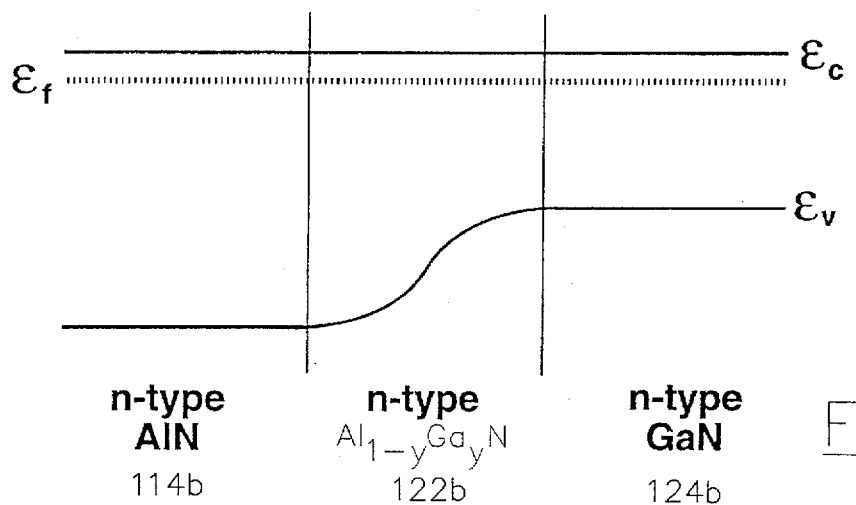
Figure 7C:
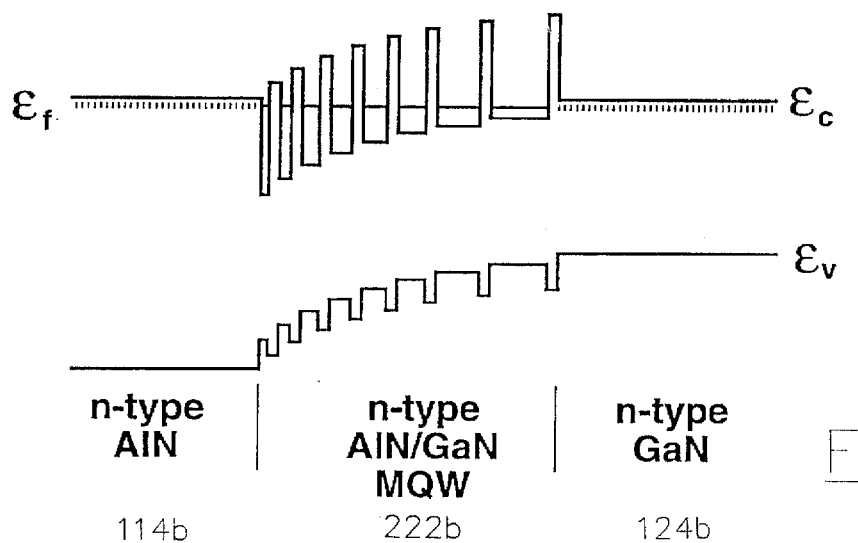
Figure 8A:
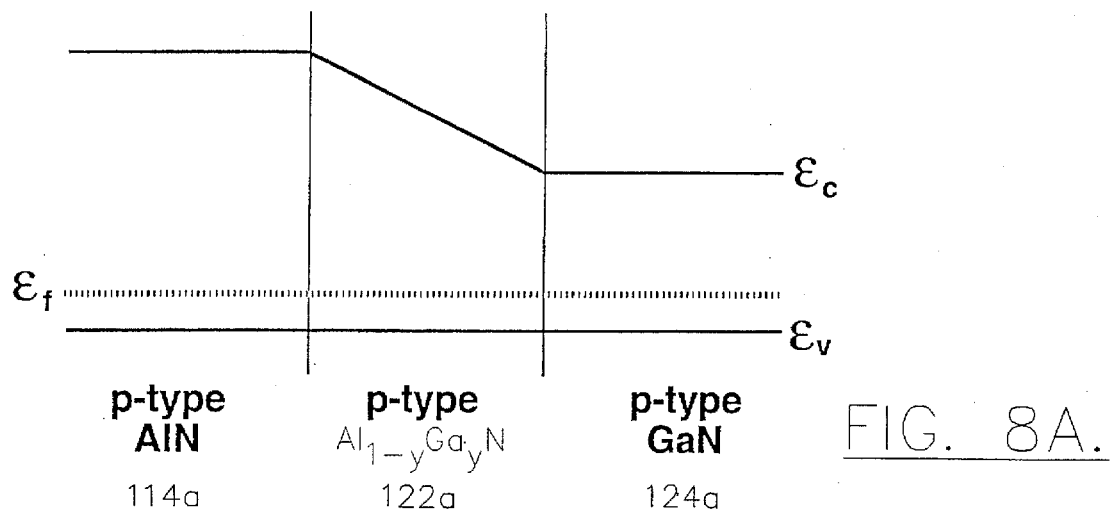
Figure 8B:
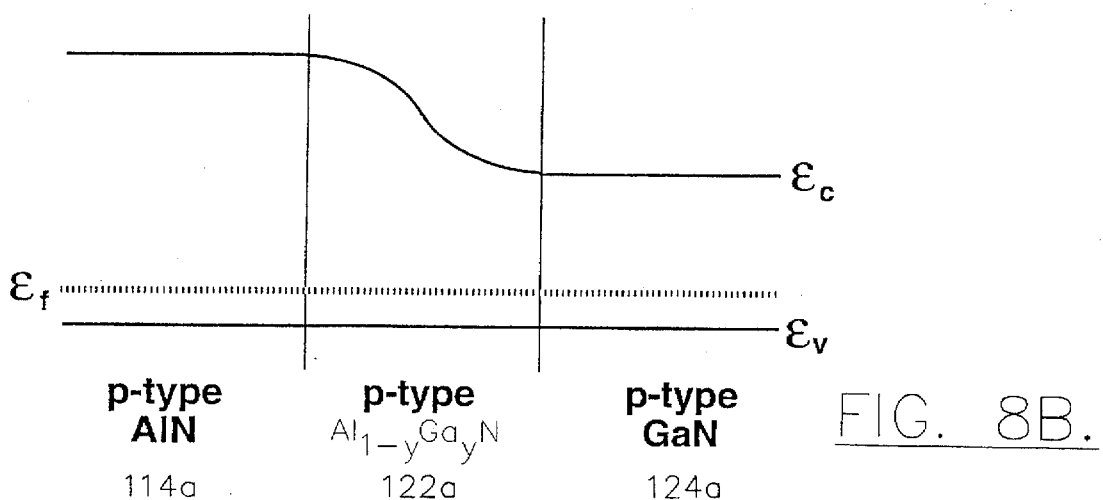
Figure 8C:
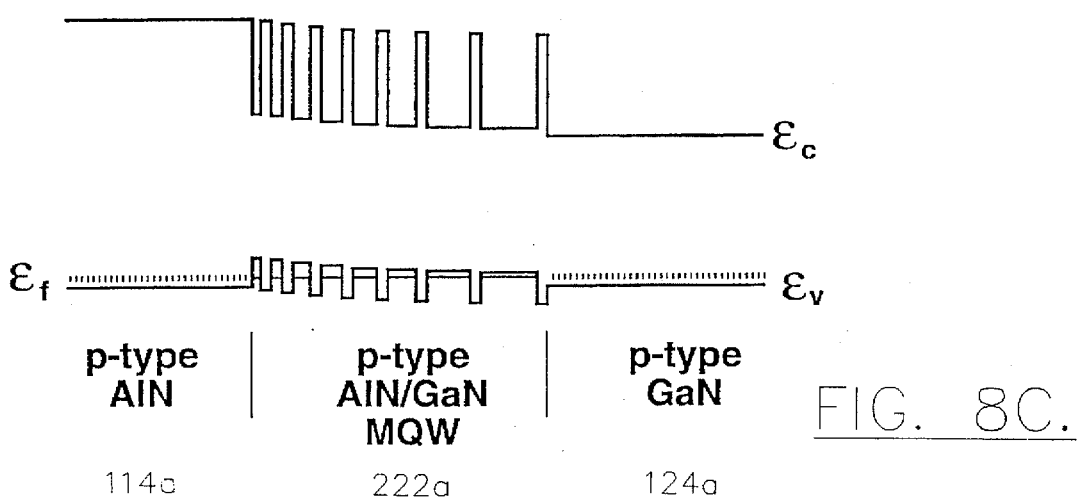
Figure 9A:
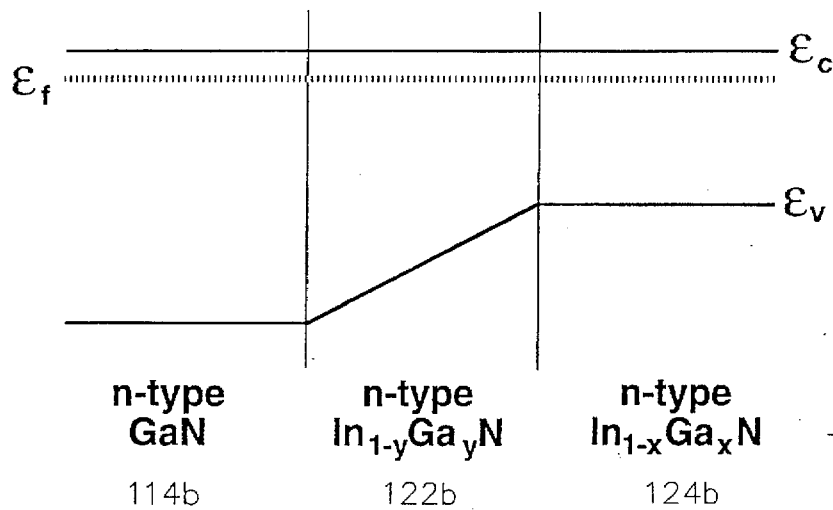
Figure 9B:
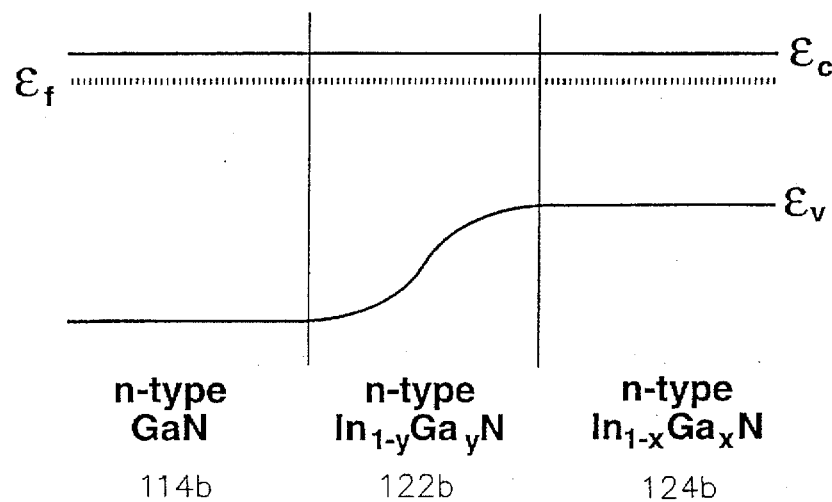
Figure 9C:
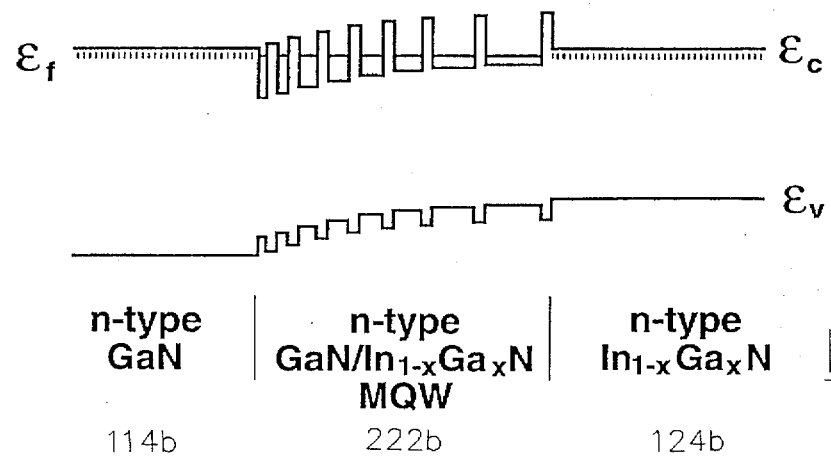
Figure 10A:
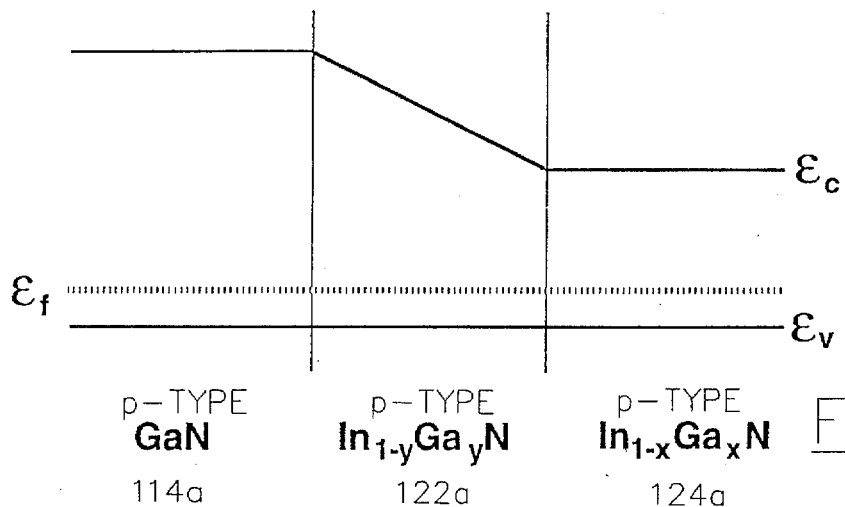
Figure 10B:
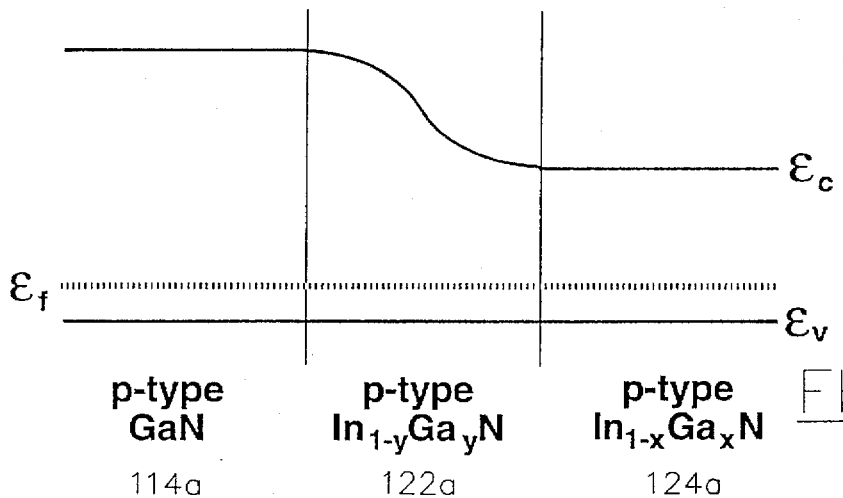
Figure 10C:
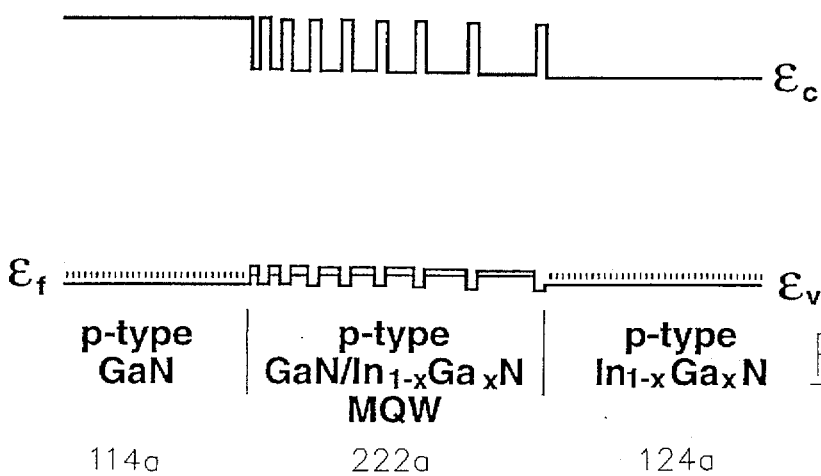
Figure 11A:
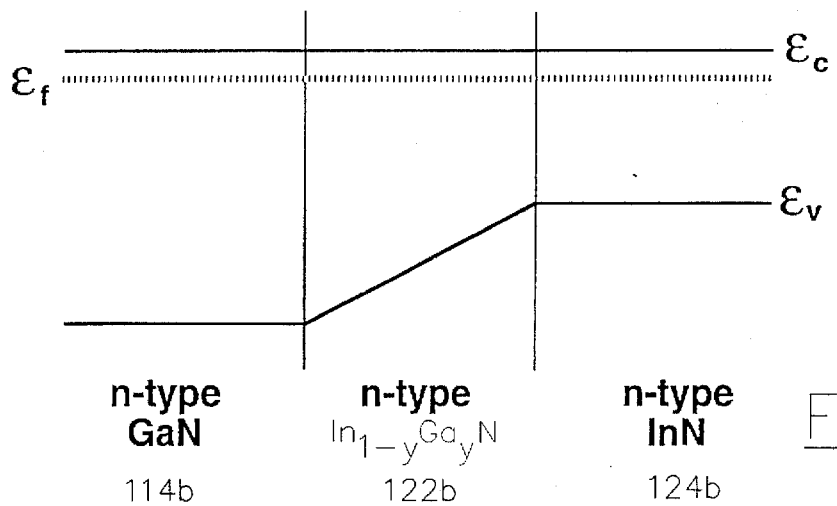
Figure 11B:
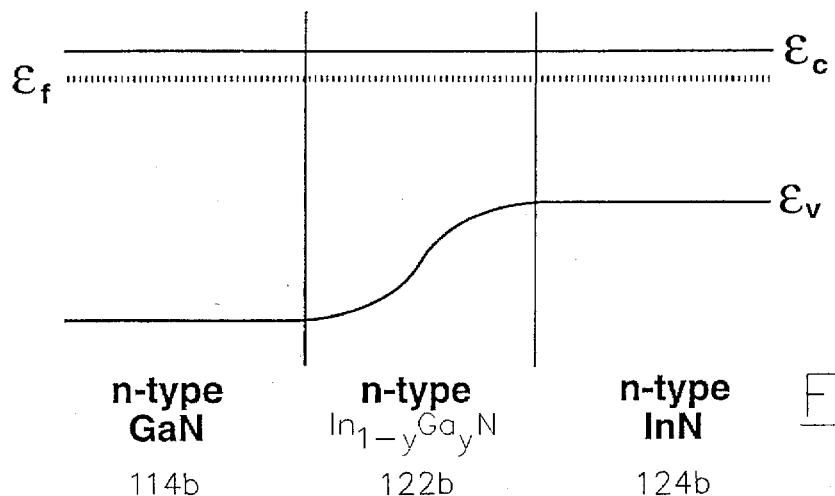
Figure 11C:
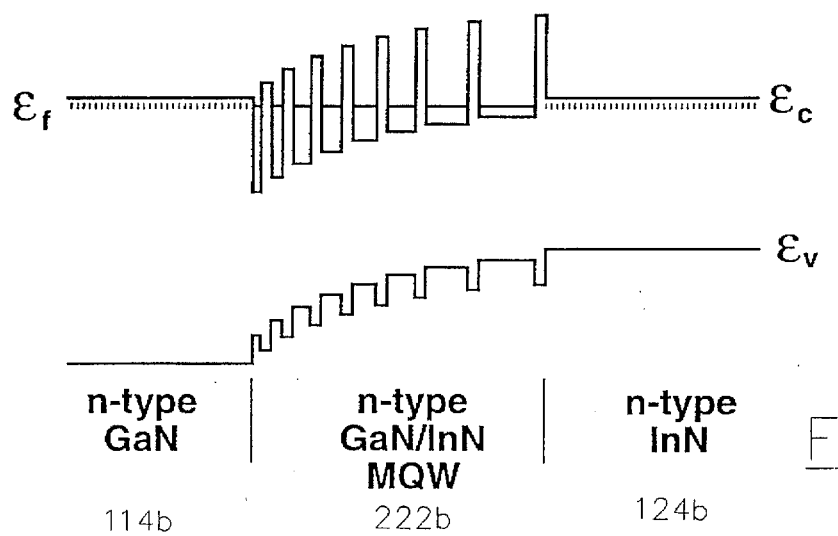
Figure 12A:
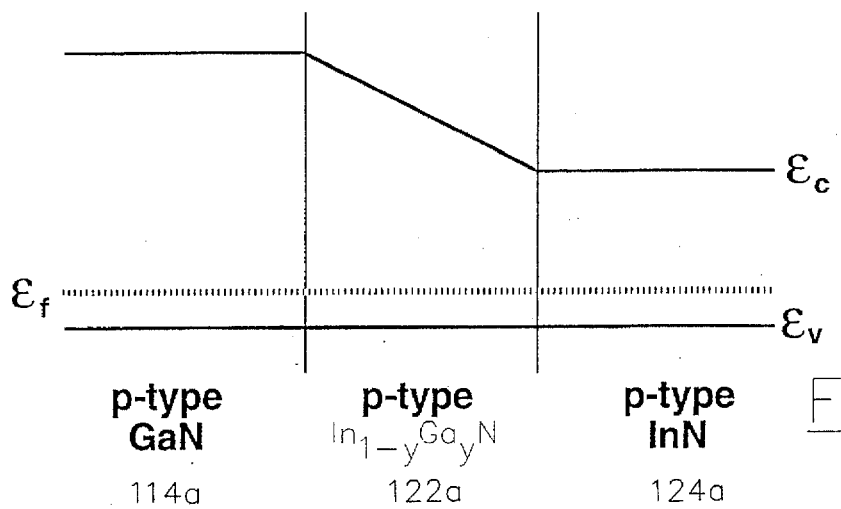
Figure 12B:
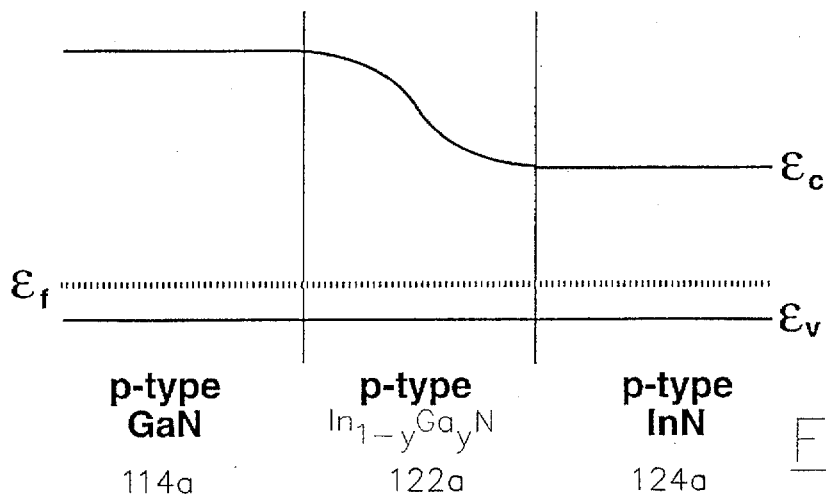
Figure 12C:
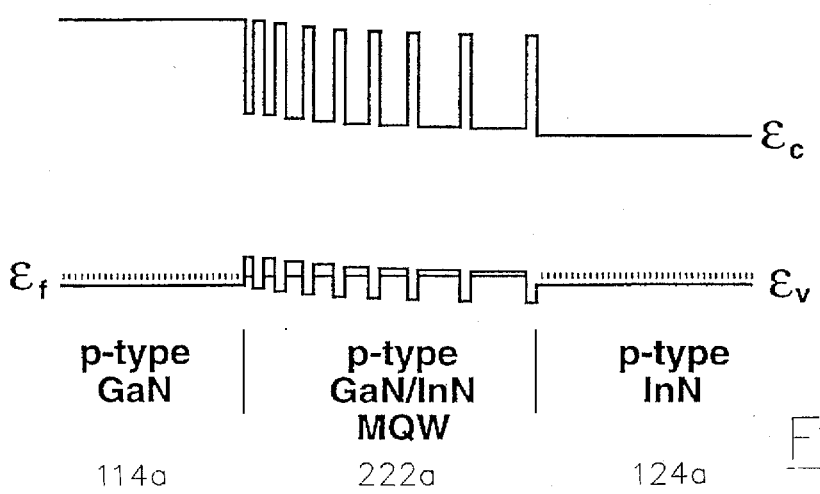

FIGS. 7A–7C show representative grading profiles for layer 122b. In a preferred embodiment, the thickness of layer 122b is chosen not to exceed the critical thickness for the formation of misfit dislocations which might otherwise occur because of the lattice mismatch between GaN and AlN.

Those skilled in the art will recognize device 300 to be a new NEA device which differs in principle from earlier NEA photocathode semiconductor devices based on compound semiconductors such as GaAs or GaP. Device 300 is a majority carrier device which, when operated under vacuum, emits majority carrier electrons across the vacuum gap 302 to a positively-biased anode 126a, which may be a metal or metal screen. Electrons flow from the negatively-biased metal 126b through the semiconductor device layers 132, 134, 124b, 122b, and into the NEA material 114b (n-type AlN) where they are emitted. Critical to this flow of electrons, as taught by this invention, is graded layer 122b which provides an ohmic contact between n-type GaN 124b and n-type AlN 114b thereby eliminating the very large (~2.1 eV) conduction band offset between these two III-V nitride materials.

In contrast, those skilled in the art will recognize that current NEA semiconductor devices are photocathodes, which are based on photogenerated minority carrier electrons in illuminated p-type GaAs, GaP, or other semiconductors. See, for example, a discussion of NEA photocathode devices in Chapter 57 of the book by Kwok K. Ng entitled *Complete Guide to Semiconductor Devices*, McGraw-Hill Series in Electrical and Computer Engineering, McGraw-Hill (New York), 1995).

Figure 27A:
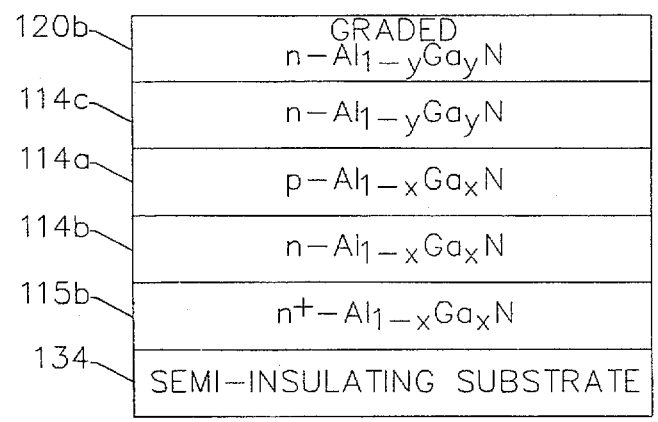
FIGS. 27A–27B illustrate an intermediate structure and a final structure, respectively, of a Group III-V nitride heterojunction bipolar transistor.
Figure 27B:
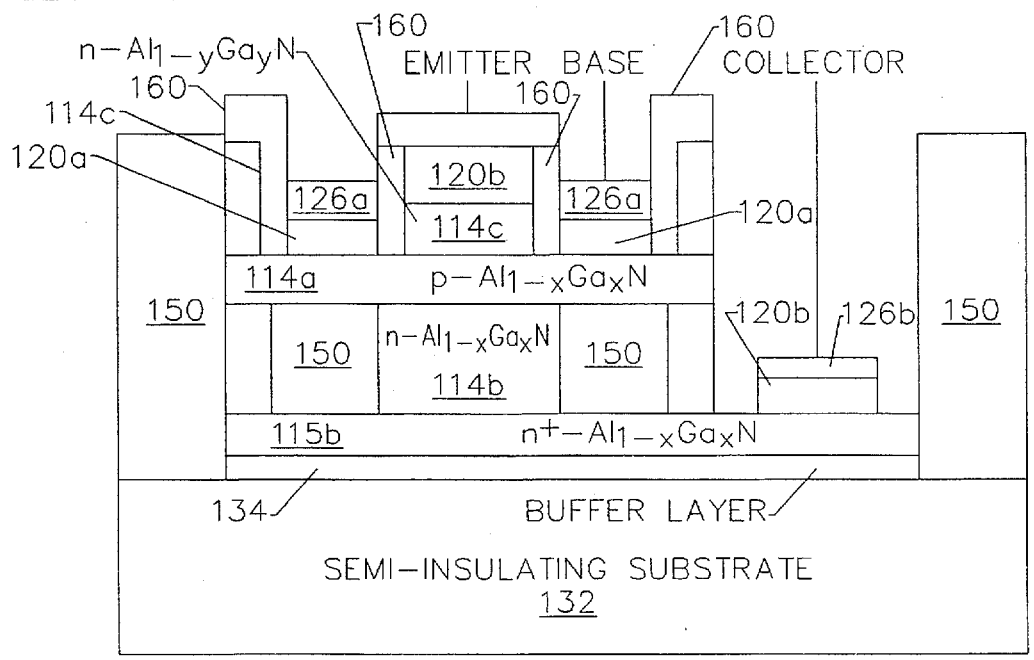

FIGS. 27A–27B illustrate a fourth embodiment of the present invention. FIG. 27A is a cross-section of integrated heterostructure device including a heterostructure (layers 114a, 114b, and 144c) designed for the fabrication of a heterojunction bipolar transistor with graded ohmic contact layer 120b and n+buffer layer 115b. The $Al_{1-y}Ga_yN$ layer 114c is fabricated such that y is less than the x-value of the $Al_{1-x}Ga_xN$ layer 114a, 114b. One skilled in the art of heterojunction bipolar transistors will recognize that for y less than x, layer 144c can function as an improved electron emitter. This is so because of the band offsets for $Al_{1-y}Ga_yN$ and $Al_{1-x}Ga_xN$ when y is less than x. Specifically, consistent with the band diagrams of FIG. 2, the valence band of $Al_{1-y}Ga_yN$ is below that $Al_{1-x}Ga_xN$ when y is less than x. As a consequence, holes flowing from the base of the device towards the emitter are blocked by this energy barrier thereby giving rise to improved device performance.

A representation of a fully processed $Al_{1-y}Ga_yN/Al_{1-x}Ga_xN$ heterojunction bipolar transistor is shown in FIG. 27B. Layer 132 is an undoped or semi-insulating substrate. Layer 134 is a nitride or non-nitride buffer layer. Layer 115b is an n+-$Al_{1-x}Ga_xN$ layer. Layer 120b is a graded ohmic contact layer for layer 115b, which may be constructed according to FIG. 3 or 4 and which is grown after a processing sequence exposes 115b. Layers 150 are device isolation layers which may be fabrication by means of ion implantation, for example. Layer 114b is an n-$Al_{1-x}Ga_xN$ layer which functions as the transistor collector layer. Layer 114a is a p-$Al_{1-x}Ga_xN$ layer which functions as the transistor base layer. Layer 120a is a graded ohmic contact layer for layer 114b, which may be constructed according to FIG. 3 or 4 and which is grown after a processing sequence exposes 114b. Layer 144c is an n-$Al_{1-y}Ga_yN$ layer which functions as the transistor emitter layer. Layer 120b is a graded ohmic contact layer for layer 114c, which may be constructed according to FIG. 3 or 4 and which is grown after a processing sequence exposes 144c, and layer 160 is an insulator such as $SiO_2$ which isolates the various device layers as shown. Also, according to the present invention, additional $In_{1-x}Ga_xN$ graded layers having the appropriate conductivity type can be inserted between the GaN layers 124 and metal contact layers 126 to further improve the ohmic contact between the GaN layers 124 and metal layers 126. This type of grading using $In_{1-x}Ga_xN$ is illustrated in FIGS. 9 through 12.

Figure 28A:
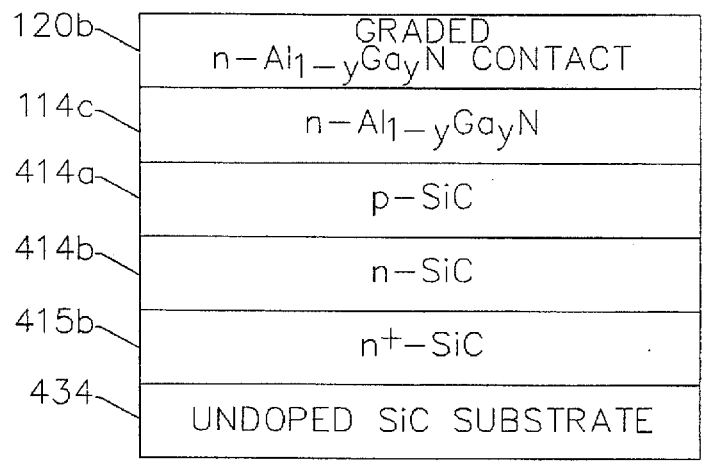
FIGS. 28A–28B illustrates an intermediate structure and a final structure, respectively, for a silicon carbide/group III-V nitride heterojunction bipolar transistor.
Figure 28B:
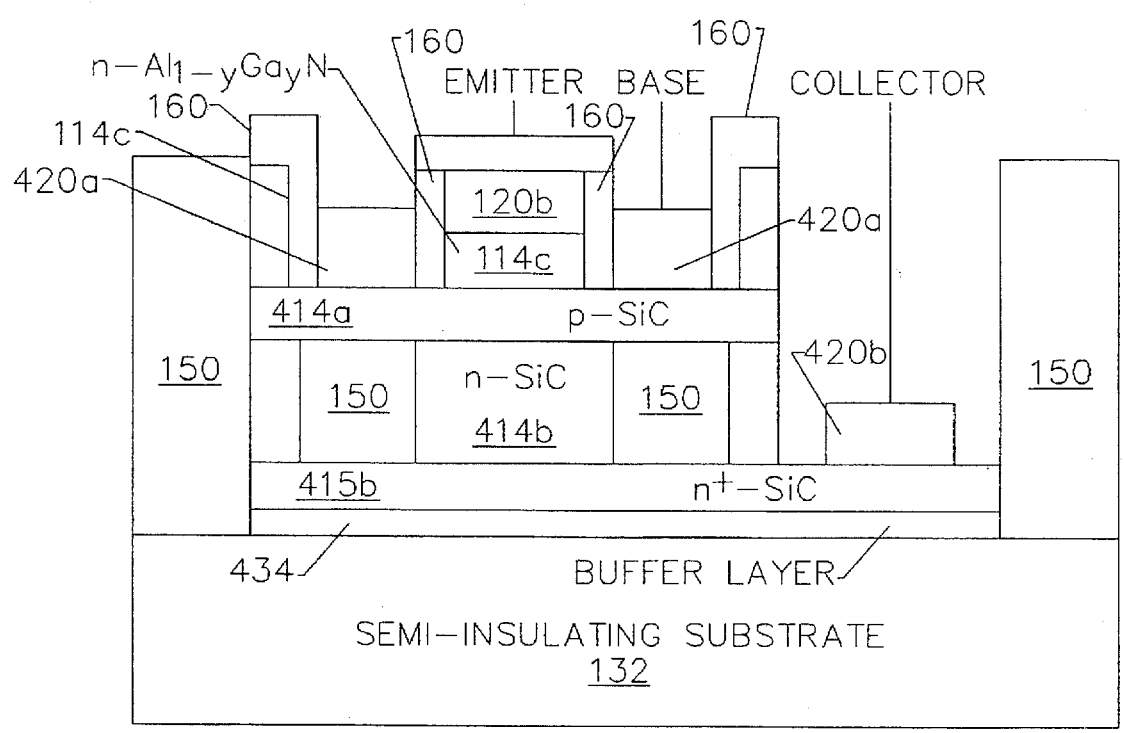

FIGS. 28A–28B show a similar $Al_{1-y}Ga_yN$ heterojunction bipolar transistor. P, n and n+layers of silicon carbide 414a, 414b and 415b respectively, are formed on undoped SiC substrate 434. Layer 144c is formed on layer 414a, and ohmic contact layer 120b is formed on layer 114c. Layers 414a, 414b, 415b and 434 function similar to layers 114a, 114b, 115b and 134 of FIG. 27B. Layers 420a and 420b may be conventional ohmic contacts (such as metal) for silicon carbide. For example, layer 420a may be gold or platinum for p-type silicon carbide, and layer 420b may be nickel for n-type silicon carbide.

Figure 29A:
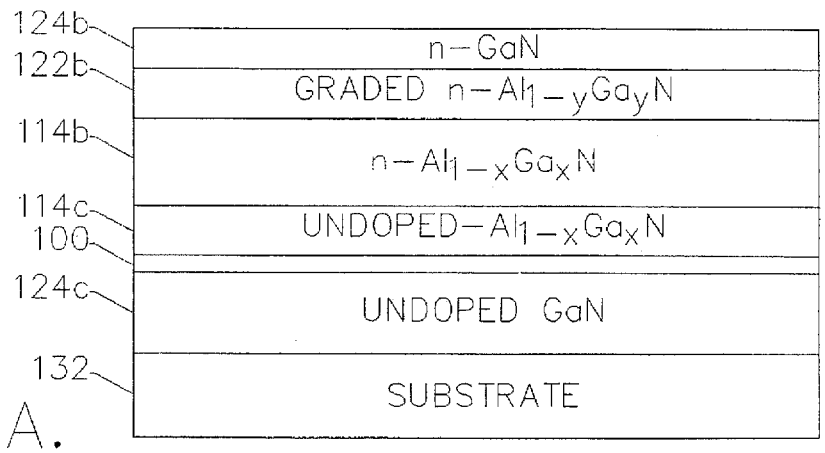
FIGS. 29A–29B illustrate an intermediate structure and a final structure, respectively, for a Group III-V nitride MODFET.
Figure 29B:
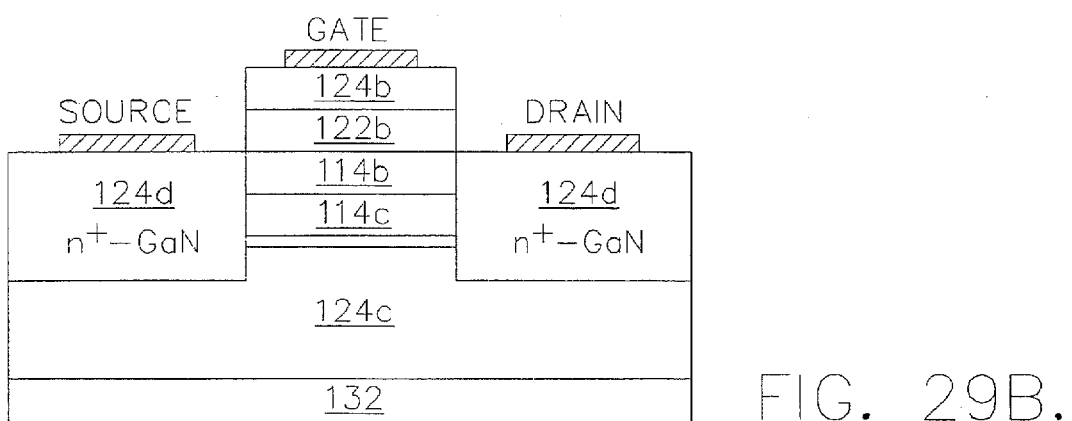

FIGS. 29A–29B show a fifth embodiment of the present invention, a modulation-doped field effect transistor (MODFET). FIG. 29A illustrates a heterostructure of Group III-V nitride layers which are grown using known techniques (MBE, MOVPE, etc.). Undoped GaN layer 124c is first deposited onto substrate 132. A buffer layer such as ZnO or AlGaN may be employed between GaN layer 124c and the substrate 124C to improve the structural quality of GaN layer 124c. Next a spacer layer 144c of undoped $Al_{1-x}Ga_xN$ (x=0.05 to 0.2) is deposited. The thickness of spacer layer 144c is typically 50 to 200 Å. Following this, an n-type layer 114b of $Al_{1-x}Ga_xN$ (x=0.05 to 0.2) is deposited. Suitable dopants for layer 114b include silicon and germanium. Layers 122b and 124b are then deposited to form a suitable ohmic contact to layer 114b.

A processed MODFET device is shown in FIG. 29B. Dry etching techniques are employed to etch down into undoped GaN layer 124c as shown. Photolithography and selective-area epitaxy is then employed to grow n+GaN layers 124d. Suitable metals are then deposited for the source, drain, and gate as shown. The MODFET of FIGS. 29A–29B is a high-electron-mobility, high-frequency device. Electrons from n-type $Al_{1-x}Ga_xN$ layer 114b transfer to the interface between layer 124c and undoped $Al_{1-x}Ga_xN$ layer 114c to form a two-dimensional (2D) electron gas 100. Since GaN layer 124c is undoped, ionized impurities are not present and, as a consequence, the electron mobility is large. Spacer layer 144c is also undoped to provide spatial separation of ionized impurities in layer 114b from the high-mobility 2D electron channel 100. Regrown epitaxial n+GaN layers 124d contact the 2D electron channel 100 and function as the device source and drain, respectively. Also, according to the present invention, additional $In_{1-x}Ga_xN$ graded layers having the appropriate conductivity type can be inserted between the GaN layers 124 and metal contact layers 126 to further improve the ohmic contact between the GaN layers 124 and metal layers 126. This type of grading using $In_{1-x}Ga_xN$ is illustrated in FIGS. 9 through 12.

Referring again to FIG. 3 and FIG. 5, additional discussion is now provided for light-emitting diode and laser diode embodiments of the present invention. For light emitting diodes, active region 112 of double heterostructure 110 of FIG. 3 and FIG. 5 is chosen to provide light emission at the desired wavelength in the violet, blue or green spectral region. Visible light emission in the violet, blue, or green can be obtained by employing $In_{1-x}Ga_xN$ for active layer 112 and doping this material with both an n-type (Si or Ge) and a p-type (Zn or Cd). The use of this doping scheme produces emission about 0.5 eV below the bandgap of $In_{1-x}Ga_xN$. The x-value of the $In_{1-x}Ga_xN$ alloy can be adjusted between x=0.95 to 0.85 to obtain emission in the violet, blue, or green spectral regions. Alternatively, Zn or Cd doped GaN (x=1) can be used as the active layer without the need for InGaN alloy to generate blue/violet light.

Figure 30:
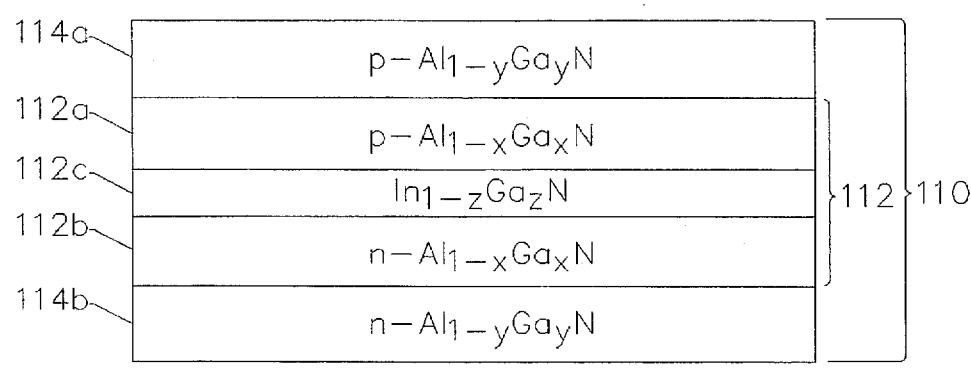
FIG. 30 illustrates active layers for a Group III-V nitride laser diode.

For laser diodes, different heterostructures are required. Referring again back to FIG. 3 and FIG. 5, a double heterostructure 110 that is appropriate for laser diode applications will now be discussed. Representative double heterostructures 110 for laser diode structures are shown in FIG. 30. $Al_{1-y}Ga_yN$ layers 114a and 114b serve as laser cladding layers which are doped n-type and p-type, respectively, as shown. $Al_{1-x}Ga_xN$ layers 112a and 112b 200–1000 Å thick) are light guiding layers while $In_{1-z}Ga_zN$ layer 112c is a quantum well (typically 30 to 100 Å thick) that serves as the light emitting layer for the laser device. Multiple quantum wells can also be employed. Table II lists x-, y-, and z-values for the various layers which serve as a guide for the fabrication of laser diodes which emit radiation in the UV, violet, and blue regions of the spectrum, respectively.

TABLE II

| Laser Type | x | y | z |
| --- | --- | --- | --- |
| UV Laser | 0.94 | 0.9 | 1.0 |
| Violet Laser | 0.94 | 0.9 | 0.8 |
| Blue Laser | 0.94 | 0.9 | 0.6 |

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An ohmic contact for a semiconductor device formed of Group III-V nitride compound semiconductor materials and including a first layer comprising a first binary Group III-V nitride compound semiconductor material or an alloy thereof, said first binary Group III-V nitride compound semiconductor material or an alloy thereof comprising a first Group III element and nitrogen, and which is doped a predetermined conductivity type, said ohmic contact comprising:

a second layer comprising a ternary Group III-V nitride compound semiconductor material, including said first group III element, a second Group III element and nitrogen, on said first layer, said ternary Group III-V nitride compound semiconductor material being doped said predetermined conductivity type and being continuously graded such that concentration of said second Group III element relative to said first Group III element increases continuously from adjacent said first layer to opposite said first layer;

a third layer comprising a second binary Group III-V nitride compound semiconductor material or an alloy thereof, including said second Group III element and nitrogen, on said second layer, said second binary Group III-V nitride compound semiconductor material or an alloy thereof being doped said predetermined conductivity type; and a conductor layer on said third layer, said second layer and said third layer forming an ohmic contact between said first layer and said conductor layer.

2. An ohmic contact according to claim 1 wherein said ternary Group III-V nitride compound semiconductor material is linearly graded such that concentration of said second Group III element relative to said first Group III element increases continuously and linearly from adjacent said first layer to opposite said first layer.

3. An ohmic contact according to claim 1 wherein said ternary Group III-V nitride compound semiconductor material is nonlinearly graded such that concentration of said second Group III element relative to said first Group III element increases continuously and nonlinearly from adjacent said first layer to opposite said first layer.

4. An ohmic contact according to claim 3 wherein said ternary Group III-V nitride compound semiconductor material is parabolically graded such that concentration of said second Group III element relative to said first Group III element increases continuously and parabolically from adjacent said first layer to opposite said first layer.

5. An ohmic contact according to claim 1 wherein said conductor layer comprises metal.

6. An ohmic contact for a semiconductor device formed of Group III-V nitride compound semiconductor materials and including a first layer comprising aluminum nitride or aluminum gallium nitride, and which is doped a predetermined conductivity type, said ohmic contact comprising:

a second layer comprising aluminum gallium nitride on said first layer, which is doped said predetermined conductivity type and which is continuously graded such that concentration of gallium relative to aluminum increases continuously from adjacent said first layer to opposite said first layer;

a third layer comprising gallium nitride or an alloy thereof on said second layer, and which is doped said predetermined conductivity type; and a conductor layer on said third layer, said second layer and said third layer forming an ohmic contact between said first layer and said conductor layer.

7. An ohmic contact according to claim 6 wherein said aluminum gallium nitride is linearly graded such that concentration of gallium relative to aluminum increases continuously and linearly from adjacent said first layer to opposite said first layer.

8. An ohmic contact according to claim 6 wherein said aluminum gallium nitride is nonlinearly graded such that concentration of gallium relative to aluminum increases continuously and nonlinearly from adjacent said first layer to opposite said first layer.

9. An ohmic contact according to claim 8 wherein said aluminum gallium nitride is parabolically graded such that concentration of gallium relative to aluminum increases continuously and parabolically from adjacent said first layer to opposite said first layer.

10. An ohmic contact according to claim 6 wherein said conductor layer comprises metal.

11. An ohmic contact according to claim 6 wherein said first layer comprises aluminum gallium nitride, and wherein the concentration of gallium relative to aluminum in said first layer is same as the concentration of gallium relative to aluminum in said second layer adjacent said first layer.

12. An integrated heterostructure device of Group III-V nitride compound semiconductor materials, comprising:

a first layer comprising a first binary Group III-V nitride compound semiconductor material or an alloy thereof, said first binary Group III-V nitride compound semiconductor material or an alloy thereof comprising a first Group III element and nitrogen, and which is doped a predetermined conductivity type;

a second layer comprising a ternary Group III-V nitride compound semiconductor material, including said first group III element, a second Group III element and nitrogen, on said first layer, said ternary Group III nitride compound semiconductor material being doped said predetermined conductivity type and being continuously graded such that concentration of said second Group III element relative to said first Group III element increases continuously from adjacent said first layer to opposite said first layer;

a third layer comprising a second binary Group III-V nitride compound semiconductor material or an alloy thereof, including said second Group III element and nitrogen, on said second layer, said second binary Group III-V nitride compound semiconductor material or an alloy thereof being doped said predetermined conductivity type; and a conductor layer on said third layer, said second layer and said third layer forming an ohmic contact between said first layer and said conductor layer.

13. An integrated heterostructure device according to claim 12 wherein said ternary Group III-V nitride compound semiconductor material is linearly or nonlinearly graded such that concentration of said second Group III element relative to said first Group III element increases continuously and linearly or nonlinearly from adjacent said first layer to opposite said first layer.

14. An integrated heterostructure device according to claim 12 wherein said conductor layer comprises metal.

15. An integrated heterostructure device according to claim 14 further comprising a second conductor layer, spaced apart from said first layer to define a carrier emission path from said first layer to said second conductor layer.

16. An integrated heterostructure device according to claim 12 further comprising:

an active device region on said first layer.

17. An integrated heterostructure device according to claim 16 further comprising:

a fourth layer comprising said first binary Group III-V nitride compound semiconductor material or an alloy thereof on said active device region, said first binary Group III-V nitride compound semiconductor material or an alloy thereof comprising a first Group III element and nitrogen, and which is doped opposite said predetermined conductivity type;

a fifth layer comprising said ternary Group III-V nitride compound semiconductor material, including said first group III element, a second Group III element and nitrogen, on said fourth layer, said ternary Group III-V nitride compound semiconductor material or an alloy thereof being doped opposite said predetermined conductivity type and being continuously graded such that concentration of said second Group III element relative to said first Group III element increases continuously from adjacent said fourth layer to opposite said fourth layer;

a sixth layer comprising said second binary Group III-V nitride compound semiconductor material or an alloy thereof, including said second Group III element and nitrogen, on said fifth layer, said second binary Group III-V nitride compound semiconductor material or an alloy thereof being doped opposite said predetermined conductivity type; and a second conductor layer on said sixth layer, said fifth layer and said sixth layer forming an ohmic contact between said fourth layer and said second conductor layer.

18. An integrated heterostructure device of Group III-V nitride compound semiconductor materials, comprising:

a first layer comprising aluminum nitride or aluminum gallium nitride, and which is doped a predetermined conductivity type;

a second layer comprising aluminum gallium nitride on said first layer, which is doped said predetermined conductivity type and which is continuously graded such that concentration of gallium relative to aluminum increases continuously from adjacent said first layer to opposite said first layer;

a third layer comprising gallium nitride or an alloy thereof on said second layer, and which is doped said predetermined conductivity type; and a conductor layer on said third layer, said second layer and said third layer forming an ohmic contact between said first layer and said conductor layer.

19. An integrated heterostructure according to claim 18 wherein said aluminum gallium nitride is linearly or non-linearly graded such that concentration of gallium relative to aluminum increases continuously and linearly or nonlinearly from adjacent said first layer to opposite said first layer.

20. An integrated heterostructure device according to claim 18 wherein said conductor layer comprises metal.

21. An integrated heterostructure device according to claim 20 further comprising a second conductor layer, spaced apart from said first layer to define a carrier emission path from said first layer to said second conductor layer.

22. An integrated heterostructure device according to claim 18 further comprising:

an active device region on said first layer.

23. An integrated heterostructure device according to claim 22 further comprising:

a fourth layer comprising aluminum nitride or aluminum gallium nitride, on said active device region, and which is doped opposite said predetermined conductivity type;

a fifth layer comprising aluminum gallium nitride on said fourth layer, which is doped opposite said predetermined conductivity type and which is continuously graded such that concentration of gallium relative to aluminum increases continuously from adjacent said fourth layer to opposite said fourth layer;

a sixth layer comprising gallium nitride or an alloy thereof on said fifth layer, and which is doped opposite said predetermined conductivity type; and a second conductor layer on said sixth layer, said fifth layer and said sixth layer forming an ohmic contact between said fourth layer and said second conductor layer.

24. An integrated heterostructure device according to claim 18 wherein said first layer comprises aluminum gallium nitride, and wherein the concentration of gallium relative to aluminum in said first layer is same as the concentration of gallium relative to aluminum in said second layer adjacent said first layer.

25. A bipolar transistor, comprising:

a base, an emitter and a collector, each of which includes a first layer comprising a first binary Group III-V nitride compound semiconductor material or an alloy thereof, said first binary Group III-V nitride compound semiconductor material or an alloy thereof comprising a first Group III element and nitrogen; and an ohmic contact for each of said base, said emitter and said collector, each ohmic contact comprising:

a second layer comprising a ternary Group III-V nitride compound semiconductor material, including said first group III element, a second Group III element and nitrogen, on said first layer, said ternary Group III-V nitride compound semiconductor material being continuously graded such that concentration of said second Group III element relative to said first Group III element increases continuously from adjacent said first layer to opposite said first layer;

a third layer comprising a second binary Group III-V nitride compound semiconductor material or an alloy thereof, including said second Group III element and nitrogen, on said second layer; and a conductor layer on said third layer, said second layer and said third layer forming an ohmic contact between the respective base, emitter and collector, and the respective conductor layer.

26. A bipolar transistor according to claim 25 wherein said base, said emitter and said collector each comprise a Group III-V nitride compound semiconductor material.

27. A heterojunction bipolar transistor according to claim 25 wherein said base and said collector each comprise silicon carbide.

28. A field effect transistor, comprising:

spaced apart source and drain regions and a channel region therebetween;

a gate adjacent said channel, said gate including a first layer comprising a first binary Group III-V nitride compound semiconductor material or an alloy thereof, said first binary Group III-V nitride compound semiconductor material or an alloy thereof comprising a first Group III element and nitrogen, and which is doped a predetermined conductivity type; and an ohmic contact for said gate, said ohmic contact comprising:

a second layer comprising a ternary Group III-V nitride compound semiconductor material, including said first group III element, a second Group III element and nitrogen, on said first layer, said ternary Group III-V nitride compound semiconductor material being doped said predetermined conductivity type and being continuously graded such that concentration of said second Group III element relative to said first Group III element increases continuously from adjacent said first layer to opposite said first layer;

a third layer comprising a second binary Group III-V nitride compound semiconductor material or an alloy thereof, including said second Group III element and nitrogen, on said second layer, said second binary Group III-V nitride compound semiconductor material or an alloy thereof being doped said predetermined conductivity type; and a conductor layer on said third layer, said second layer and said third layer forming an ohmic contact between said first layer and said conductor layer.

29. A field effect transistor according to claim 28 wherein said channel region includes a layer of undoped ternary Group III-V nitride compound semiconductor material, to produce a modulation doped field effect transistor, and wherein said first layer is on said layer of undoped ternary Group III-V nitride compound semiconductor material.

* * * * *